US008668956B2

(12) United States Patent
Inoue et al.

(10) Patent No.: US 8,668,956 B2
(45) Date of Patent: Mar. 11, 2014

(54) VAPOR DEPOSITION PARTICLE EMITTING DEVICE, VAPOR DEPOSITION APPARATUS, VAPOR DEPOSITION METHOD

(75) Inventors: Satoshi Inoue, Osaka (JP); Shinichi Kawato, Osaka (JP); Tohru Sonoda, Osaka (JP); Satoshi Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/985,281

(22) PCT Filed: Mar. 7, 2012

(86) PCT No.: PCT/JP2012/055803
§ 371 (c)(1),
(2), (4) Date: Aug. 13, 2013

(87) PCT Pub. No.: WO2012/124654
PCT Pub. Date: Sep. 20, 2012

(65) Prior Publication Data
US 2013/0323882 A1    Dec. 5, 2013

(30) Foreign Application Priority Data
Mar. 14, 2011    (JP) .................. 2011-055962

(51) Int. Cl.
*C23C 16/448*    (2006.01)
*C23C 14/26*    (2006.01)

(52) U.S. Cl.
USPC .................. 427/248.1; 118/726; 118/727

(58) Field of Classification Search
USPC .................. 118/726, 727
See application file for complete search history.

(56) References Cited

U.S. PATENT DOCUMENTS

| 4,789,779 | A  | * | 12/1988 | Drullinger ............... 250/251 |
| 5,108,535 | A  | * | 4/1992 | Ono et al. ............... 156/345.35 |
| 6,770,562 | B2 | * | 8/2004 | Yamazaki et al. ........... 438/679 |
| 2002/0108572 | A1 |  | 8/2002 | Yamazaki et al. |
| 2007/0204798 | A1 | * | 9/2007 | Iwasaki et al. ............... 118/726 |
| 2011/0053300 | A1 |  | 3/2011 | Ryu et al. |

FOREIGN PATENT DOCUMENTS

| EP | 1418250 A2 | 5/2004 |
| JP | 2004-137583 A | 5/2004 |
| JP | 2007-092149 A | 4/2007 |
| JP | 2008-069459 A | 3/2008 |
| JP | 2011-047035 A | 3/2011 |

OTHER PUBLICATIONS

International Search Report received for PCT Patent Application No. PCT/JP2012/055803, mailed on May 22, 2012, 5 pages (2 pages of English Translation and 3 pages of Search Report).

* cited by examiner

*Primary Examiner* — Keath T Chen
*Assistant Examiner* — Aiden Lee
(74) *Attorney, Agent, or Firm* — Morrison & Foerster LLP

(57) ABSTRACT

A vapor deposition particle injection device (30) includes a vapor deposition particle generating section (41), at least one nozzle stage made of an intermediate nozzle section (51), a vapor deposition particle emitting nozzle section (61), and heat exchangers (43, 63, 53). The vapor deposition particle emitting nozzle section (61) is controlled so as to be at a temperature lower than a temperature at which a vapor deposition material turns into gas. Meanwhile, the intermediate nozzle section (51) is controlled by the heat exchanger (53) so as to be at a temperature between a temperature of the vapor deposition particle generating section (41) and a temperature of the vapor deposition particle emitting nozzle section (61).

13 Claims, 14 Drawing Sheets

VAPOR DEPOSITION MATERIAL

Figure 1:
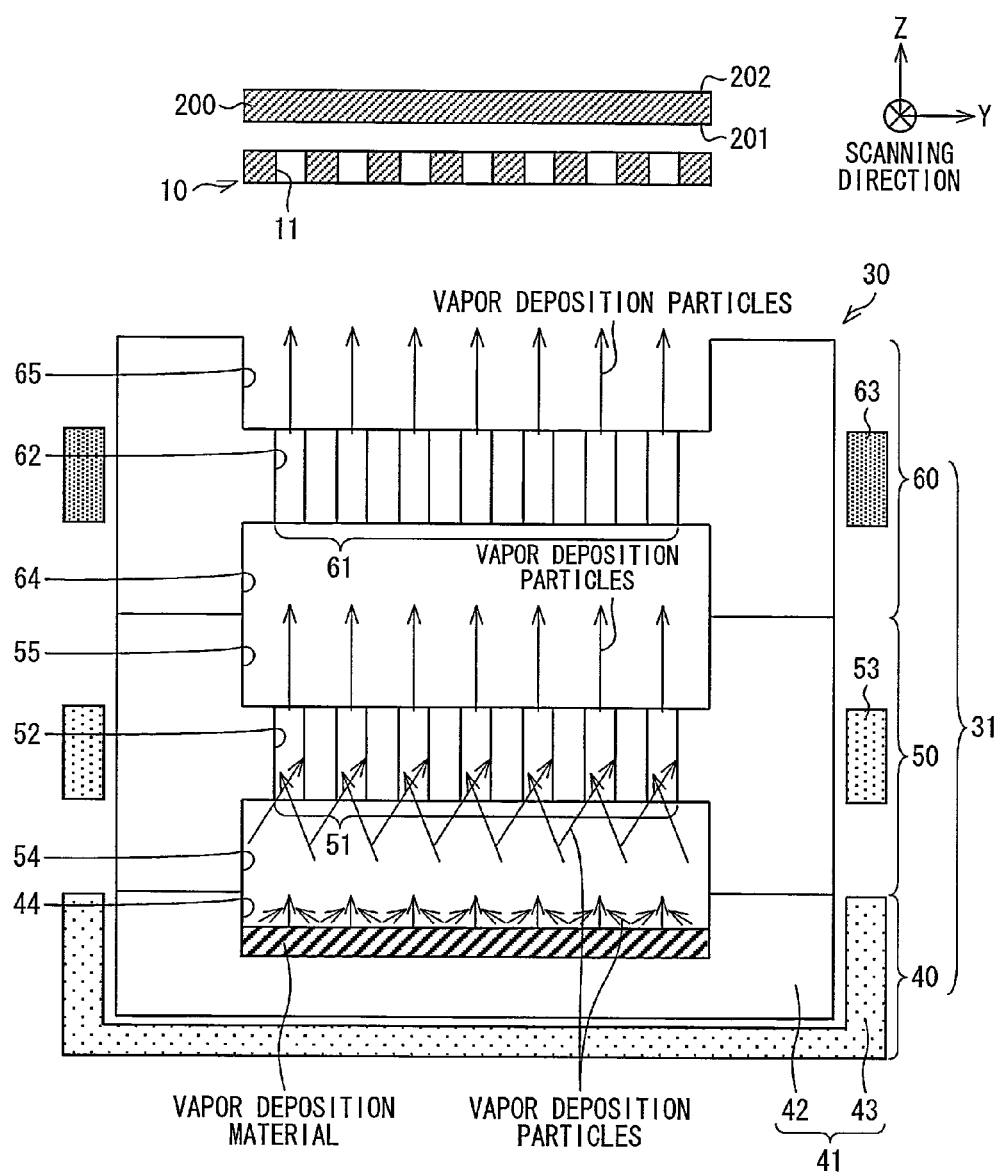

Z
Y
SCANNING DIRECTION

VAPOR DEPOSITION PARTICLE EMITTING DEVICE, VAPOR DEPOSITION APPARATUS, VAPOR DEPOSITION METHOD

CROSS REFERENCE TO RELATED APPLICATIONS

This is a U.S. National Phase patent application of PCT/JP2012/055803, filed Mar. 7, 2012, which claims priority to Japanese patent application no. 2011-055962, filed Mar. 14, 2011, each of which is hereby incorporated by reference in the present disclosure in its entirety.

TECHNICAL FIELD

The present invention relates to a vapor deposition particle injection device, a vapor deposition apparatus including the vapor deposition particle injection device as a vapor deposition source, and a vapor deposition method using the vapor deposition apparatus.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic EL element which uses electroluminescence (hereinafter abbreviated to "EL") of an organic material and that (ii) is an all-solid-state flat-panel display which is excellent in, for example, low-voltage driving, high-speed response, and self-emitting characteristics.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of high-luminance light emission based on low-voltage direct-current driving, and includes in its structure a first electrode, an organic EL layer, and a second electrode stacked on top of one another in that order, the first electrode being connected to a TFT.

The organic EL layer between the first electrode and the second electrode is an organic layer including a stack of layers such as a hole injection layer, a hole transfer layer, an electron blocking layer, a luminescent layer, a hole blocking layer, an electron transfer layer, and an electron injection layer.

A full-color organic EL display device typically includes, as sub-pixels aligned on a substrate, organic EL elements of red (R), green (G), and blue (B). The full-color organic EL display device carries out an image display by, with use of TFTs, selectively causing the organic EL elements to each emit light with a desired luminance.

The organic EL elements in a light-emitting section of such an organic EL display device is generally formed by multi-layer vapor deposition of organic films. In production of an organic EL display device, it is necessary to form, for each organic EL element that is a light-emitting element, at least a luminescent layer of a predetermined pattern made of an organic luminescent material which emits light of the colors.

In formation of films in a predetermined pattern by multi-layer vapor deposition, a method such as a vapor deposition method that uses a mask referred to as a shadow mask, an inkjet method or a laser transfer method is applicable. Among these methods, the vapor deposition method that uses a mask referred to as a shadow mask is the most common method.

In a vapor deposition method employing a mask called a shadow mask, a vapor deposition source that evaporates or sublimates a vapor deposition material is provided in a chamber inside which a reduced-pressure condition can be maintained. Then, for example, under a high-vacuum condition, the vapor deposition source is heated, and thereby the vapor deposition material is evaporated or sublimated.

Thus evaporated or sublimated vapor deposition material is vapor-deposited, as vapor deposition particles, onto a film formation target substrate onto which a film is to be formed. This vapor deposition is carried out through apertures provided to the mask for vapor deposition, so that a desired film pattern is formed.

Patent Literature 1 discloses a material supplying device as a vapor deposition particle injection device, according to one example of vapor deposition methods each employing a mask called a shadow mask as described above. This material supplying device controls an amount of the vapor deposition material from the vapor deposition source which vapor deposition material has been evaporated or sublimated, and thereby stabilizes a speed of film formation of a vapor-deposited film.

Figure 18:
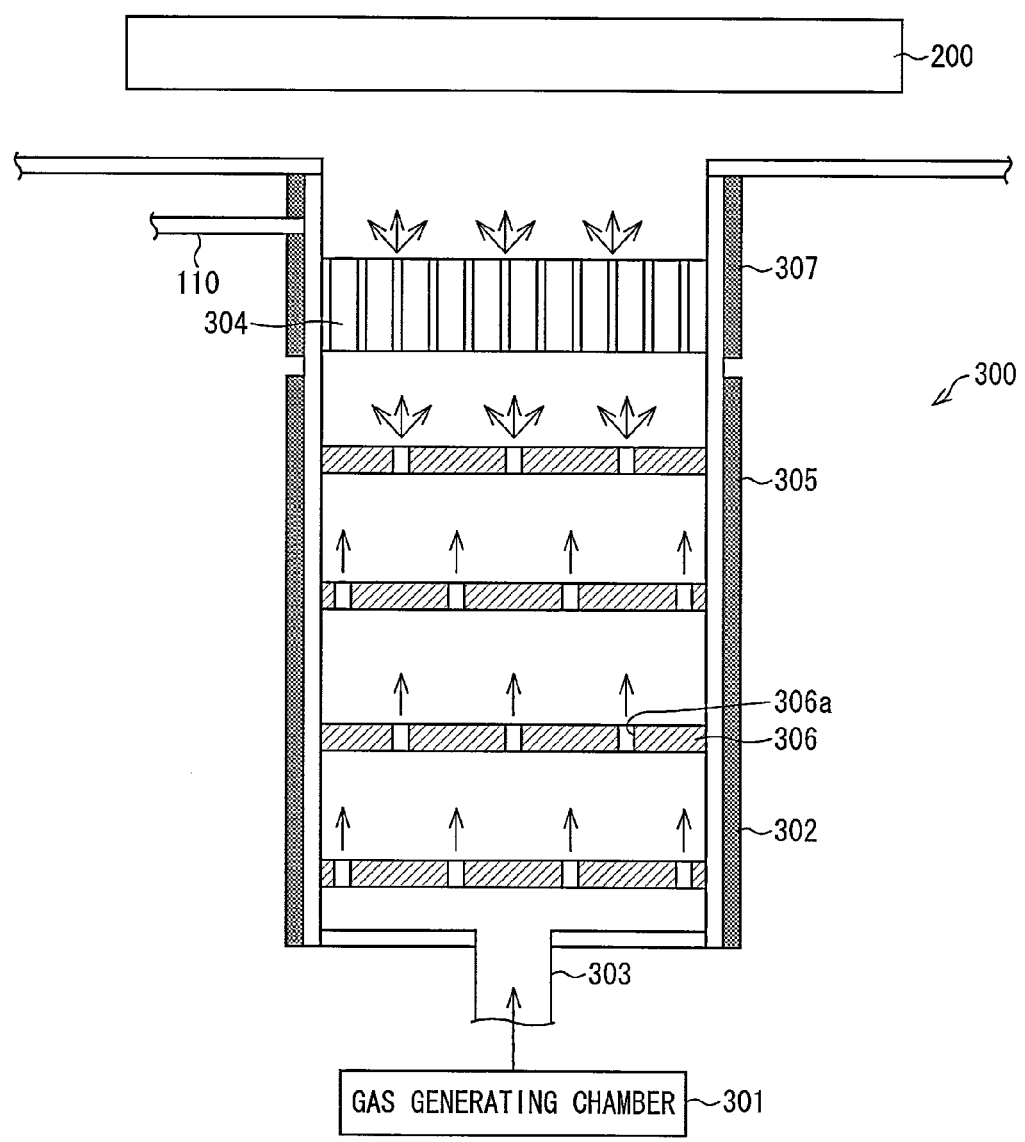

FIG. 18 is a cross sectional view schematically illustrating the material supplying device as disclosed in Patent Literature 1.

As illustrated in FIG. 18, a material supplying device 300 as described in Patent Literature 1 is configured to include (i) a gas generating chamber 301 that heats up a vapor deposition material to a first temperature so as to evaporate or sublimate the vapor deposition material and that thereby converts the vapor deposition material into a gaseous material, (ii) a temperature adjustment chamber 302 that controls a temperature of the gaseous material, and (iii) a piping section 303 that connects the gas generating chamber 301 and the temperature adjustment chamber 302.

Further, in the vicinity of an exit of the temperature adjustment chamber 302, a slit section 304 is provided. This slit section 304 serves as a mask for vapor deposition. This configuration allows the gaseous material to be vapor-deposited onto the film formation target substrate 200 through the slit section 304.

On an upstream side in the temperature adjustment chamber 302 with respect to the slit section 304 (i.e. on a side of the temperature adjustment chamber 302 on which side the temperature adjustment chamber 302 is connected to the piping section 303), a first heater 305 is provided. This first heater 305 lowers the temperature of the vapor deposition material (gaseous material) that has been evaporated or sublimated, to a second temperature that is lower than the first temperature.

The temperature adjustment chamber 302 is provided with a plurality of multi-hole plates 306. Each of the plurality of multi-hole plates 306 is provided with a plurality of apertures 306a through which the gaseous material passes. When the gaseous material comes in contact with a multi-hole plate 306, heat exchange occurs. As a result, the temperature of the gaseous material is controlled so as to be at the second temperature.

Further, at the slit section 304 and on a downstream side with respect to the slit section 304 in the temperature adjustment chamber 302, a second heater 307 is provided. The second heater 307 raises the temperature of the gaseous material to a third temperature that is higher than the second temperature on the upstream side with respect to the slit section 304.

In Patent Literature 1, the material (gaseous material) that has been evaporated or sublimated is saturated by setting the temperature of the material to the second temperature that is lower than the first temperature in the temperature adjustment chamber 302 so that the material is at a saturated vapor pressure. This prevents a supply amount of the gaseous material from varying depending on a change in temperature. Meanwhile, at the slit section 304 and on the downstream side with respect to the slit section 304, the gaseous material is heated to the third temperature that is higher than the second temperature so that the gaseous material is prevented from solidifying.

More specifically, in Patent Literature 1, as the vapor deposition material, $Alq_3$ (aluminum quinolinol complex, aluminato-tris-8-hydroxyquinolate) is used as a host material of a luminescent layer. Further, the first temperature is set in a range of 350° C. to 400° C., the second temperature is set in a range of 300° C. to 350° C., and the third temperature is set in a range of 350° C. to 400° C.

CITATION LIST

Patent Literatures

[Patent Literature 1] Japanese Patent Application Publication, Tokukai, No. 2007-92149 (Publication Date: Apr. 12, 2007)

SUMMARY OF INVENTION

Technical Problem

However, in Patent Literature 1, collimation of a flow of vapor deposition particles (vapor deposition flow) is not considered. Accordingly, though the plurality of multi-hole plate 306 are aligned in an up-and-down direction, positions of the apertures 306a of any one of the plurality of multi-hole plates 306 do not agree, respectively, with those of another one of the plurality of multi-hole plates 306. In addition, the positions of the apertures 306a of a top multi-hole plate 306 do not agree, respectively, with positions of slits of the slit section 304. Therefore, at the slit section 304, the vapor deposition flow is scattered.

Further, because a sublimation temperature of $Alq_3$ is 305° C., the gaseous material is heated at the slit section 304 and on the downstream side with respect to the slit section 304, to a temperature that is higher than an evaporation temperature or the sublimation temperature, in Patent Literature 1 as described above. This spreads a vapor deposition flow. However, Patent Literature 1 does not have any configuration for blocking an oblique-flow component of thus scattered vapor deposition flow. This causes blurring of a formed film pattern.

In this way, in a conventional vapor deposition apparatus, a pattern cannot be formed with a predetermined precision. As a result, it has not been possible to produce a panel with a high display quality.

The present invention is attained in view of the above problems. An object of the present invention is to provide a vapor deposition particle injection device and a vapor deposition apparatus, and a vapor deposition method each of which makes it possible to suppress blurring of a formed film pattern and to produce a high display quality panel.

Solution to Problem

In order to solve the above problems, a vapor deposition particle injection device of the present invention includes: (1) a vapor deposition particle generating section generating vapor deposition particles in a gas phase, by heating a vapor deposition material; (2) a vapor deposition particle emitting nozzle section provided with a plurality of through holes for emitting the vapor deposition particles generated in the vapor deposition particle generating section, to outside the vapor deposition particle generating section; and (3) at least one intermediate nozzle section (at least one nozzle stage made of an intermediate nozzle section) including a plurality of through holes, and being provided between the vapor deposition particle generating section and the vapor deposition particle emitting nozzle section so as to be apart from the vapor deposition particle generating section and the vapor deposition particle emitting nozzle section and so as to overlap the vapor deposition particle generating section and the vapor deposition particle emitting nozzle section, the vapor deposition particle generating section of (1), the vapor deposition particle emitting nozzle section of (2), and the intermediate nozzle section of (3) including temperature adjustment members, respectively, the vapor deposition particle emitting nozzle section of (1) being controlled by a corresponding temperature adjustment member so as to be at a temperature that is lower than a temperature at which the vapor deposition material turns into gas, the intermediate nozzle section (3) being controlled by a corresponding temperature adjustment member so as to be at a temperature between a temperature of the vapor deposition particle generating section and the temperature of the vapor deposition particle emitting nozzle section.

Note that the temperature at which the vapor deposition material turns into gas in the above description indicates an evaporation temperature in a case where the vapor deposition material is evaporated or a sublimation temperature in a case where the vapor deposition material is sublimated.

In the above configuration, the through holes in the vapor deposition particle emitting nozzle section that injects, outward from the vapor deposition particle generating section, the vapor deposition particles generated in the vapor deposition particle generating section is set at a temperature that is lower than a temperature at which the vapor deposition material turns into gas, as described above. This makes it possible to block an oblique-flow component of a vapor deposition flow. Therefore, collimation of the vapor deposition flow becomes possible.

In this configuration, the intermediate nozzle section configured as described above is provided. Then, a temperature of the vapor deposition particles lowers when the vapor deposition particles pass through the through holes in the intermediate nozzle section.

Accordingly, because a stepwise decrease in temperature of the above nozzle sections from the vapor deposition particle generating section to the vapor deposition particle emitting nozzle section can be achieved, it becomes possible to linearize a flow of the vapor deposition particles and thereby to reduce the vapor deposition material that adheres to respective wall surfaces of the nozzle sections.

Further, by reducing the temperature of the vapor deposition particles at the intermediate nozzle section, a pressure can be reduced locally at the through holes in the vapor deposition particle emitting nozzle section. This makes it possible to prevent the vapor deposition particles from being scattered at the through holes in the vapor deposition particle emitting nozzle section.

Furthermore, because the pressure in and in the vicinity of the vapor deposition particle emitting nozzle section is reduced as described above, it is possible to prevent a phenomenon in which a mean free path of the vapor deposition particles becomes shorter at the vapor deposition particle emitting nozzle section. This allows a further improvement in collimation characteristic of a vapor deposition flow.

Accordingly, in the above configuration, the vapor deposition particles injected from the vapor deposition particle injection device is vapor-deposited onto the film formation target substrate through the through holes provided in a vapor deposition mask that is provided so as to face the vapor deposition particle injection device. This can make (i) directions in which the vapor deposition particles travel from a position at which the vapor deposition particles have been injected from the vapor deposition particle injection device to a position at which the vapor deposition particles reach the vapor deposition mask be parallel to (ii) a normal direction with respect to the film formation target surface of the film formation target substrate (i.e., a normal direction with respect to a mask surface of the vapor deposition mask), at the time when a desired film pattern is to be formed.

Accordingly, when the vapor deposition particle injection device is applied to a vapor deposition apparatus and a vapor deposition method each for carrying out vapor deposition with use of a vapor deposition mask, the vapor deposition particles that travel in a direction perpendicular to the mask surface of the vapor deposition mask pass through the through holes in the vapor deposition mask and then adhere to the film formation target substrate in conformity with a mask pattern. This makes it possible to eliminate blurring of a formed film pattern and therefore to form a film pattern with a high accuracy.

Meanwhile, the vapor deposition particles in the oblique-flow component is caused to adhere to wall surfaces (nozzle wall surfaces) of the through holes by setting a temperature of the through holes of the vapor deposition particle emitting nozzle section lower than a temperature at which the vapor deposition material turns into gas, as described above. This is for enhancing a straight travelling characteristic of the vapor deposition particles as described above. In this case, when the intermediate nozzle section is not provided and a temperature of the vapor deposition flow is lowered at a time by lowering the temperature of the vapor deposition particle emitting nozzle section at a time, an amount of the vapor deposition particles that adhere on the nozzle wall surfaces increase. This tends to clog the vapor deposition particle emitting nozzle section.

However, in the above configuration, the vapor deposition flow is collimated at the intermediate nozzle section that is a preceding nozzle stage to the vapor deposition particle emitting nozzle section, before the vapor deposition particles arrive at the vapor deposition particle emitting nozzle section. This makes it possible to suppress/prevent adhesion of the vapor deposition particles onto the wall surfaces of the through holes in the vapor deposition particle emitting nozzle section.

In order to solve the above problems, a vapor deposition apparatus of the present invention, for forming a film in a predetermined pattern on a film formation target substrate, the vapor deposition apparatus includes: (1) the vapor deposition particle injection device of the present invention; (2) a vapor deposition mask including through holes, the vapor deposition mask allowing the vapor deposition particles having been injected from the vapor deposition particle injection device to pass through the through holes so that the vapor deposition particles are vapor-deposited onto the film formation target substrate, the vapor deposition mask having an area that is smaller than an area of a vapor deposition target region of the film formation target substrate; and (3) moving means that moves at least one of the film formation target substrate and a set of the vapor deposition particle injection device and the vapor deposition mask relative to the other, in a state where the vapor deposition mask and the film-formed substrate are kept apart by a constant distance from each other.

In order to solve the above problems, a vapor deposition method includes the step of forming a film in a predetermined pattern on a film formation target substrate by use of the vapor deposition apparatus of the present invention, by moving at least one of the film formation target substrate and a set of the vapor deposition particle injection device and the vapor deposition mask relative to the other, in a state where the vapor deposition mask and the film formation target substrate are kept apart by a constant distance from each other.

In a case where a vapor-deposited film is formed by use of a vapor deposition mask that is smaller in area than the vapor deposition target region of the film formation target substrate in a state where the film formation target substrate and the vapor deposition mask are set apart from each other, conventionally, vapor deposition particles having travelled from the vapor deposition particle injection device and having passed through the through holes (mask aperture pattern) in the vapor deposition mask are scattered by the through holes in the vapor deposition mask. Thus scattered vapor deposition particles adhere to the film formation target substrate, so that a film pattern is formed.

Accordingly, conventionally, blurring has occurred in a formed film pattern. It has not been possible to form a film pattern with a predetermined accuracy.

However, in each of the above described configurations, the vapor deposition apparatus includes the vapor deposition particle injection device. This can make (i) directions in which the vapor deposition particles travel from a position at which the vapor deposition particles have been injected from the vapor deposition particle injection device to a position at which the vapor deposition particles reaches the vapor deposition mask be parallel to (ii) the normal direction with respect to the film formation target surface of the film formation target substrate (i.e., a normal direction with respect to a mask surface of the vapor deposition mask).

Therefore, the vapor deposition particles that travel in a direction that is perpendicular to the mask surface of the vapor deposition mask pass through the through holes in the vapor deposition mask and then adhere to the film formation target substrate in conformity with a mask pattern. This makes it possible to eliminate blurring of a formed film pattern and therefore to form a film pattern with a high accuracy.

Advantageous Effects of Invention

According to the present invention, the vapor deposition particle emitting nozzle section having the through holes serving as injection holes in the vapor deposition particle injection device is controlled so as to be at a temperature that is lower than a temperature at which the vapor deposition material turns into gas. This makes it possible to block an oblique-flow component of a vapor deposition flow and thereby collimate the vapor deposition flow.

Further, according to the present invention, the vapor deposition particle injection device includes the intermediate nozzle section between the vapor deposition particle emitting nozzle section and the vapor deposition particle generating section that generates the vapor deposition particles in a gas phase by heating the vapor deposition material. This intermediate nozzle section is set at a temperature that is between a temperature of the vapor deposition particle generating section and a temperature of the vapor deposition particle emitting nozzle section. This makes it possible to achieve a stepwise decrease in temperature of the above nozzle sections from the vapor deposition particle generating section to the vapor deposition particle emitting nozzle section.

This configuration makes it possible to linearize a flow of the vapor deposition particles and thereby to reduce the vapor deposition material that adheres to respective wall surfaces of the nozzle sections. Thereby, the above configuration also makes it possible to prevent the particle emitting nozzle section from clogging.

Further, by reducing the temperature of the vapor deposition particles at the intermediate nozzle section, a pressure at the through holes in the vapor deposition particle emitting nozzle section can be locally reduced. This makes it possible not only to prevent the vapor deposition particles from being scattered at the through holes in the vapor deposition particle emitting nozzle section but also to prevent a phenomenon in which a mean free path of the vapor deposition particles becomes shorter at the vapor deposition particle emitting nozzle section. This allows a further improvement in collimation characteristic of a vapor deposition flow.

Accordingly, when the vapor deposition particle injection device is applied to a vapor deposition apparatus and a vapor deposition method each for carrying out vapor deposition with use of a vapor deposition mask, the vapor deposition particles that travel in a direction perpendicular to the mask surface of the vapor deposition mask pass through the through holes in the vapor deposition mask and then adhere to the film formation target substrate in conformity with a mask pattern. This makes it possible to eliminate blurring of a formed film pattern and therefore to form a film pattern with a high accuracy.

BRIEF DESCRIPTION OF DRAWINGS

FIG. 1 is a cross sectional view schematically illustrating main components in a vacuum chamber in a vapor deposition apparatus according to Embodiment 1 of the present invention.

FIG. 2 is a cross sectional view schematically illustrating a configuration of a substantial part of the vapor deposition apparatus according to Embodiment 1 of the present invention.

FIG. 3 is an overhead view illustrating the main components in the vacuum chamber in the vapor deposition apparatus according to Embodiment 1 of the present invention.

FIG. 4 is a cross sectional view schematically illustrating, for comparison, a vapor deposition particle injection device in a case where a cooling temperature control unit is provided so as to be adjacent to a heating temperature control unit.

FIG. 5 is a cross sectional view schematically illustrating a configuration of an organic EL display device.

FIG. 6 is a cross sectional view schematically illustrating a configuration of an organic EL element constituting a display section of the organic EL display device.

FIG. 7 is a flowchart illustrating a production process of an organic EL display device in the order of steps.

(a) of FIG. 8 is a diagram showing an optical micrograph of a formed film pattern obtained by using, as a vapor deposition source, the vapor deposition particle injection device illustrated in FIG. 1; and (b) of FIG. 8 is a diagram showing an optical micrograph of a formed film pattern obtained by using, as a vapor deposition source, the vapor deposition particle injection device illustrated in FIG. 4.

FIG. 9 is a plan view schematically illustrating one example of an outline configuration of a substantial part of the vapor deposition particle injection device according to Embodiment 1 of the present invention.

FIG. 10 is a cross sectional view schematically illustrating an outline configuration of a vapor deposition particle injection device according to Embodiment 2 of the present invention.

FIG. 11 is a diagram showing an optical micrograph of a formed film pattern obtained by using the vapor deposition particle injection device as illustrated in FIG. 10.

FIG. 12 is a plan view schematically illustrating one example of an outline configuration of a substantial part of the vapor deposition particle injection device according to Embodiment 2 of the present invention.

FIG. 13 is a cross sectional view schematically illustrating main components in a vacuum chamber of a vapor deposition apparatus according to Embodiment 3 of the present invention.

FIG. 14 is a cross sectional view schematically illustrating an outline configuration of a substantial part of the vapor deposition apparatus according to Embodiment 3 of the present invention.

FIG. 15 is a diagram illustrating an optical micrograph of a formed film pattern obtained by using the vapor deposition apparatus according to Embodiment 3 of the present invention.

FIG. 16 is a cross sectional view schematically illustrating main components in a vacuum chamber of a vapor deposition apparatus according to Embodiment 4 of the present invention.

FIG. 17 is a cross sectional view schematically illustrating main components in a vacuum chamber of a vapor deposition apparatus according to Embodiment 5 of the present invention.

FIG. 18 is a cross sectional view schematically illustrating a material supplying device as described in Patent Literature 1.

DESCRIPTION OF EMBODIMENTS

The following discusses embodiments of the present invention.

Embodiment 1

The following discusses one embodiment of the present invention, with reference to FIGS. 1 through 9.

<Vapor Deposition System>

The following discusses a vapor deposition system employed in a vapor deposition method according to Embodiment 1, with reference to FIG. 3.

FIG. 3 is an overhead view illustrating main components in a vacuum chamber in a vapor deposition apparatus according to Embodiment 1.

As illustrated in FIG. 3, in the vapor deposition apparatus and the vapor deposition method according to Embodiment 1, vapor deposition, i.e., film formation is carried out in a state where a mask 10 (vapor deposition mask) for vapor deposition, which is called a shadow mask, is arranged to be apart from a film formation target substrate 200.

In the vapor deposition apparatus and the vapor deposition method according to Embodiment 1, respective positions of the mask 10 and the vapor deposition particle injection device 30 as a vapor deposition source relative to each other are fixed. The vapor deposition particle injection device 30 and the mask 10 are kept apart from each other so that a predetermined distance is kept between the vapor deposition particle injection device 30 and the mask 10 in a z-axis direction which is a direction perpendicular to a mask surface of the mask 10 (i.e., a surface where apertures are formed in the mask 10).

Figure 3:
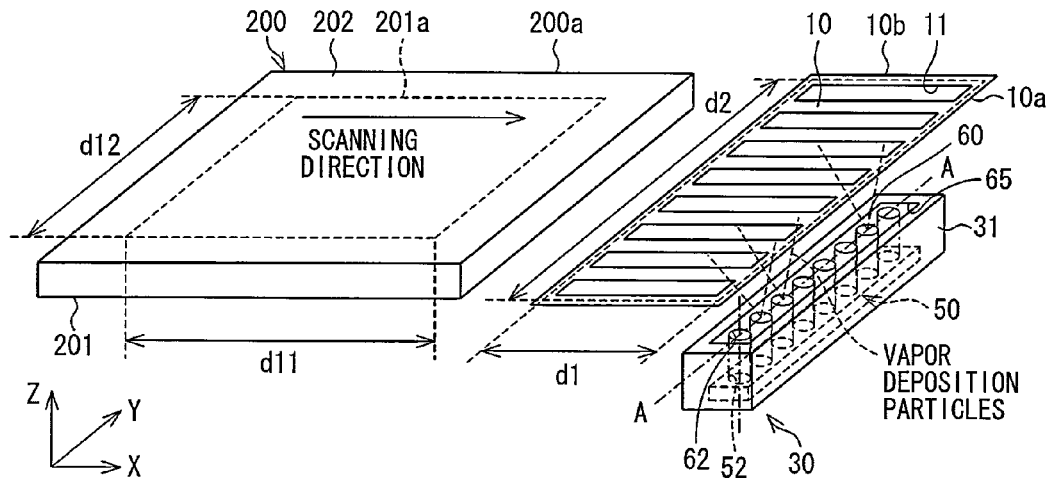

Note that Embodiment 1 described below discusses a case, as an example, where as illustrated in FIG. 3, a vapor deposition material is vapor-deposited on the film formation target substrate 200 through apertures 11 (through holes) that are provided in the mask 10. The mask 10 used in this case is smaller in size than the film formation target substrate 200. Further, vapor deposition in this case is carried out by (i) fixing the vapor deposition particle injection device 30 and the mask 10, and (ii) carrying (in-line transfer) the film formation target substrate 200 in a direction parallel to a longitudinal direction of the film formation target substrate 200 and thereby causing the film formation target substrate 200 to pass above the mask 10.

However, the present invention is not limited to this arrangement. That is, while the film formation target substrate 200 is fixed, the vapor deposition particles injection device 30 and the mask 10 may be moved. In other words, at least one of the film formation target substrate 200 and a set of the vapor deposition particle injection device 30 and the mask 10 may be moved relative to the other.

Further, a direction of a long side 200a of the film formation target substrate 200 with respect to the mask 10 is not limited to the above arrangement. Depending on a size of the film formation target substrate 200, the mask 10 and the film formation target substrate 200 may certainly be arranged so that the long side 200a of the film formation target substrate 200 is parallel to a long side 10a of the mask 10.

Further, it is only necessary to fix the respective positions of the vapor deposition particle injection device 30 and the mask 10 relative to each other. Accordingly, the vapor deposition particle injection device 30 and the mask 10 may be integrally provided as a mask unit by use of a single holding member such as a holder, or alternatively, may be separately provided.

In a case where the set of the vapor deposition particle injection device 30 and the mask 10 are moved relative to the film formation target substrate 200, the set of the vapor deposition particle injection device 30 and the mask 10 may be moved by use of one moving mechanism while being held by a single holding member.

<Overall Configuration of Vapor Deposition Apparatus>

Figure 2:
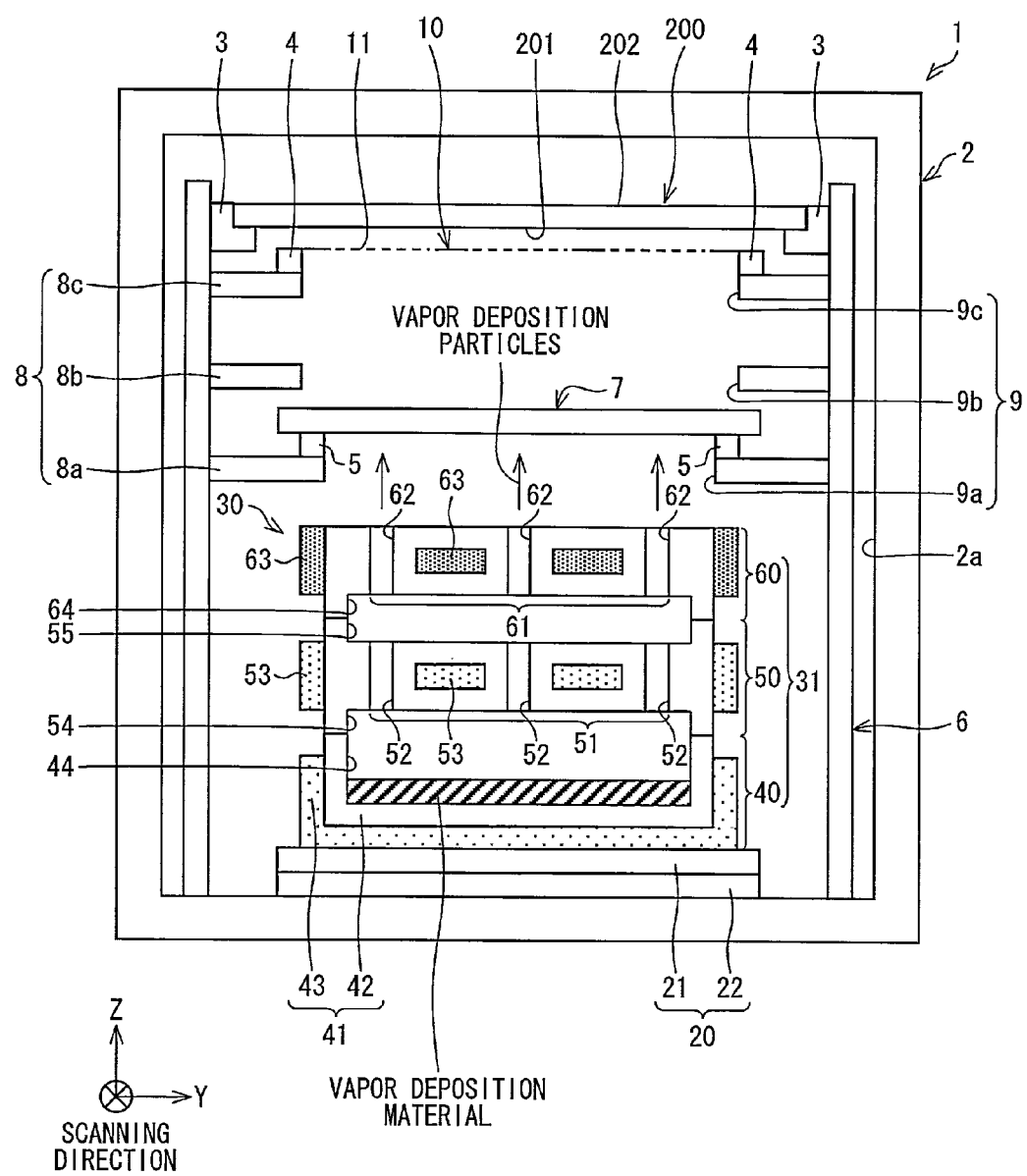

FIG. 1 is a cross sectional view schematically illustrating main components in the vacuum chamber in the vapor deposition apparatus according to Embodiment 1. FIG. 2 is a cross sectional view schematically illustrating a configuration of a substantial part of the vapor deposition apparatus according to Embodiment 1.

Note that FIGS. 1 and 2 each schematically illustrate a cross section, taken along line A-A of FIG. 3, of a configuration of a substantial part in the vapor deposition apparatus. Note that in FIG. 2, the configuration is simplified by omitting a large number of the apertures in the mask for vapor deposition and a large number of apertures as injection holes in the vapor deposition particle injection device.

For convenience of illustration, FIG. 1 through 3 each have a different number of apertures as the injection holes in the vapor deposition particle injection device. This by no means influences effects of Embodiment 1 and therefore by no means varies the effects obtained by Embodiment 1.

As illustrated in FIG. 2, the vapor deposition apparatus 1 of Embodiment 1 is configured to include, as illustrated in FIG. 2, a vacuum chamber 2 (film forming chamber), and a substrate moving unit 3, a mask moving unit 4, a shutter operation unit 5, a holder 6, a shutter 7, a mask 10 (vapor deposition mask), a vapor deposition particle injection device shifting unit 20, and a vapor deposition particle injection device 30 (vapor deposition source) which are provided in the vacuum chamber 2.

<Configuration of Vacuum Chamber 2>

The vacuum chamber 2 is provided with a vacuum pump (not illustrated) that performs vacuum-pumping of the vacuum chamber 2 via an exhaust port (not illustrated) of the vacuum chamber 2 so that a vacuum state is kept inside the vacuum chamber 2 during vapor deposition.

<Configuration of Substrate Moving Unit 3>

The substrate moving unit 3 (substrate transfer unit) includes a motor (not illustrated) such as an XYθ drive motor. While holding the film formation target substrate 200, the substrate moving unit 3 moves the vapor deposition target substrate 200 by driving the motor by use of a motor drive control section (not illustrated).

The substrate moving unit 3 moves the film formation target substrate 200 such as a TFT substrate, while holding the film formation target substrate 200 so that a film formation target surface 201 of the film formation target substrate 200 faces a mask surface of the mask 10.

As illustrated in FIG. 3, Embodiment 1 employs the mask 10 that is smaller in size than the film formation target substrate 200. Further, the substrate moving unit 3 is used for carrying (in-line transfer) the film formation target substrate 200 in an X-axis direction in an YX plane so that the film formation target substrate 200 passes above the mask 10. Thereby, vapor deposition of a vapor deposition material is carried out.

Furthermore, on the film formation target substrate 200, an alignment marker (not illustrated) is provided for alignment between the mask 10 and the film formation target substrate 200.

The substrate moving unit 3 drives a motor (not illustrated) such as an XYθ drive motor as described above and thereby corrects a position of the film formation target substrate 200 to an appropriate position by eliminating misalignment of the film formation target substrate 200.

<Configuration of Mask 10>

As illustrated in FIG. 3, Embodiment 1 employs the mask 10 that is a rectangular (belt shape) vapor deposition mask. By using such a mask 10, the film formation target substrate 200 is scanned in a direction along a longitudinal direction of the film formation target substrate 200.

The shadow mask 10, as illustrated in FIGS. 1 through 3, has a plurality of apertures 11 (through holes) arranged in a one-dimensional direction and each having, for example, a belt shape (stripe shape).

The plurality of apertures 11 are provided so that a longitudinal direction of each of the apertures 11 is parallel to a scanning direction (substrate carrying direction, X-axis direction in FIGS. 1 through 3). The plurality of apertures 11 are provided so as to be aligned in a direction (Y-axis direction in FIGS. 1 through 3) perpendicular to the scanning direction.

In Embodiment 1, as illustrated in FIG. 3, the plurality of apertures 11 each stretching in a direction parallel to a short side 10b of the mask 10 are aligned in a longitudinal direction of the mask 10.

As illustrated in FIG. 3, the mask 10 of Embodiment 1 is formed so that in a direction parallel to the scanning direction of the film formation target substrate 200, a width d1 of each of the apertures 11 of the mask 10 is shorter than a width d11 of a film formation target region (panel region 201a) on the film formation target surface 201 of the film formation target substrate 200.

Meanwhile, the mask 10 of Embodiment 1 is formed so that in a direction perpendicular to the scanning direction of the film formation target substrate 200, for example, a width d2 of a vapor deposition region (i.e., a region where a group of apertures 11 are formed) of the mask 10 is arranged so as to correspond to, for example, a width d12 of the film formation target region (panel region 201a) of the film formation target substrate 200. This makes it possible to form a film all over the film formation target region by one scan, in the direction perpendicular to the scanning direction of the film formation target substrate 200. Note, however, that Embodiment 1 is not limited to this configuration.

Note that a region where deposition of the vapor deposition particles is undesirable on the film formation target substrate 200 is covered with the shutter 7 and a projecting section 8, as illustrated in FIG. 2. The projecting section 8 serves as a deposition preventing plate in the holder 6. The projection section 8 will be described later.

Further, note that the mask 10 is preferably a metal mask, for example. However, the mask 10 is not limited to a metal mask.

<Configuration of Mask Moving Unit 4>

As illustrated in FIG. 2, the mask moving unit 4 includes a motor (not illustrated) such as an XYθ drive motor. While holding the mask 10 for vapor deposition, the mask moving unit 4 moves the mask 10 by driving the motor by use of a motor drive control section (not illustrated). The mask moving unit 4 moves the mask 10 while keeping the respective positions of the mask 10 and the vapor deposition particle injection device 30 relative to each other.

Though the respective positions of the mask 10 and the vapor deposition particle injection device 30 relative to each other are fixed, there still exists a minute operation region in which alignment is to be carried out.

In other words, the relative positional relation of the mask 10 and the vapor deposition particle injection device 30 is fixed except for a case where alignment, minute adjustment such as a space adjustment, or the like is carried out.

On the mask 10, an alignment marker (not illustrated) is provided for alignment of the mask 10 and the film formation target substrate 200. Further, on the mask 10, an absolute alignment marker (not illustrated) is provided for absolute alignment of the mask 10 and the vapor deposition apparatus 1. Meanwhile, in the vacuum chamber 2, a reference marker (not illustrated) for absolute alignment is provided so as to correspond to an absolute position of the mask 10.

Note that the above absolute position of the mask 10 is determined in advance in designing a device, in accordance with respective positions of the mask 10 and the vapor deposition apparatus 1 relative to each other or respective positions of the mask 10 and the vapor deposition particle injection device 30 relative to each other.

As described above, the mask moving unit 4 drives a motor (not illustrated) such as an XYθ drive motor as described above and thereby corrects a position of the mask 10 to an appropriate position by eliminating misalignment of the mask 10.

<Configuration of Shutter 7>

As illustrated in FIG. 2, the shutter 7 is provided between the mask 10 and the vapor deposition particle injection device 30, so as to control whether or not the vapor deposition particles injected from the vapor deposition particle injection device 30 are allowed to reach the mask 10. The shutter 7 determines whether or not to inject the vapor deposition particles toward the film formation target substrate 200.

The shutter 7 prevents the vapor deposition particles from being injected in the vacuum chamber 2 when a vapor deposition rate is to be stabilized or vapor deposition is not required. For example, during alignment of the film formation target substrate 200 and the mask 10, the shutter 7 blocks an injection path of the vapor deposition particles so as to prevent the vapor deposition particles from reaching the film formation target substrate 200.

The shutter 7 is arranged so that, for example, the shutter operation unit 5 can move back and forth (insert) the shutter 7 between the mask 10 and the vapor deposition particle injection device 30.

The shutter 7 covers apertures 62 that serve as injection holes for the vapor deposition particles (vapor deposition material) in the vapor deposition particle injection device 30 while a film is not being formed on the vapor deposition target substrate 200.

<Configuration of Shutter Operation Unit 5>

As illustrated in FIG. 2, the shutter operation unit 5 holds the shutter 7 and operates the shutter 7 in accordance with a vapor deposition OFF signal/vapor deposition ON signal from a control section (not illustrate) that is provided outside the vacuum chamber.

The shutter operation unit 5 includes, for example, a motor (not illustrated). The shutter operation unit 5 operates (moves) the shutter 7 by driving the motor by use of a motor drive control section (not illustrated). For example, the shutter operation unit 5 inserts the shutter 7 between the mask 10 and the vapor deposition particle injection device 30 in accordance with the vapor deposition OFF signal from the control section (not illustrated) and thereby closes the apertures 62 that serve as the injection holes for the vapor deposition particle injection device 30. Meanwhile, the shutter operation unit 5 is caused to work in accordance with the vapor deposition ON signal from the control section (not illustrated) and thereby opens the apertures 62.

As described above, by causing the shutter operation unit 5 to work and thereby inserting as appropriate the shutter 7 between the mask 10 and the vapor deposition particle injection device 30, it is possible to prevent vapor deposition on an unwanted region (non-vapor-deposition-target region) of the film formation target substrate 200.

<Configuration of Holder 6>

Further, as illustrated in FIG. 2, in the vacuum chamber 2, the holder 6 is provided so as to be adjacent to an inner wall 2a of the vacuum chamber 2. This holder 6 serves both as a deposition preventing plate and as means for holding components in the vacuum chamber.

The holder 6 is provided so as to cover a region where the vapor deposition particles might fly in the vacuum chamber 2 but where deposition of the vapor deposition particles is not desirable (The above region covered with the holder 6 is a region where the vapor deposition particles might unnecessarily fly, other than an injection path that is a region where the vapor deposition particles are required to fly). The region includes, for example, a region surrounding the vapor deposition particle injection device 30 and the inner wall 2a of the vacuum chamber 2, while excluding an injection path of the vapor deposition particles which injection path connects the apertures 62 serving as injection holes of the vapor deposition particle injection device 30 and an aperture region (region where a group of apertures are formed) of the mask 10.

The holder 6 is provided with a plurality of projecting sections 8 each of which is arranged to have an opening 9 that serves as a vapor flow discharge opening. Note that FIG. 2 illustrates, as one example, a case where the holder 6 is provided with three projecting sections 8 including a first projecting section 8a having a first opening 9a, a second projecting section 8b having a second opening 9b, and a third projecting section 8c having a third opening 9c in this order from the vapor deposition particle injection device 30 side.

In one example configuration, the mask moving unit 4 is held by the first projecting section 8a while the shutter operation unit 5 is held by the third projecting section 8c. Further, the substrate moving unit 3 is provided above the first projecting section 8a so as to overlap the first projection section 8a.

As illustrated in FIG. 2, in the vapor deposition apparatus 1, the vapor deposition particles injected from the vapor deposition particle injection device 30 are regulated so that the vapor deposition particles fly below the mask 10. The vapor deposition particles that fly beyond a region below the mask 10 are blocked as appropriate by the holder 6 that also serves as a deposition preventing plate (shielding plate).
This makes it possible to prevent the vapor deposition particles from being undesirably deposited on a region other than the aperture region of the mask 10, and thereby to prevent contamination of such a region.

<Configuration of Vapor Deposition Particle Injection Device Shifting Unit 20>

The vapor deposition particle injection device 30 is provided so as to face the film formation target substrate 200 via the mask 10. As described above, the respective positions of the mask 10 and the vapor deposition particle injection device 30 relative to each other are fixed.

Note that in Embodiment 1, the vapor deposition particle injection device 30 is fixed to a bottom wall of the vacuum chamber 2 via the vapor deposition particle injection device shifting unit 20. Meanwhile, the mask 10 is held by and fixed to the first projecting section 8a of the holder 6 via the mask moving unit 4. In this way, the respective positions of the vapor deposition particle injection device 30 and the mask 10 relative to each other are fixed.

However, there also exists a minute operation region in which alignment is to be carried out for the vapor deposition particle injection device 30.

The vapor deposition particle injection device shifting unit 20 includes, for example, an actuator 22 and a stage 21 such as an XYZ stage (see FIG. 2).

The stage 21 and the actuator 22 are provided so as to be adjacent to the vapor deposition particle injection device 30.

The stage 21 holds the vapor deposition particle injection device 30. Further, the stage 21 includes a motor (not illustrated) such as an XYθ drive motor, and thereby shifts the vapor deposition particle injection device 30 by driving the motor by use of a motor drive control section (not illustrated).

The actuator 22 is a Z-axis drive actuator. The actuator 22 converts a control signal to motion in a Z-axis direction that is perpendicular to the surface where the apertures are formed to the mask 10, and thereby controls a space (separation distance) between the mask 10 and the deposition particle injection device 30.

Note that the space between the mask 10 and the vapor deposition particle injection device 30 can be set as appropriate and not specifically limited. However, the space is desired to be as small as possible for enhancing efficiency in utilization of the vapor deposition material. In one example case, the space is set to approximately 100 mm.

As described above, preferably, the vapor deposition particle injection device 30 is provided in such a manner that the vapor deposition particle injection device 30 can be freely shifted by the vapor deposition injection device shifting unit 20, in any of the X-axis direction, the Y-axis direction, and the Z-axis direction.

<Configuration of Vapor Deposition Particle Injection Device 30>

The vapor deposition particle injection device 30 evaporates or sublimates, under high vacuum, the vapor deposition material that is a film formation material by heating the vapor deposition material, and then, injects, as the vapor deposition particles, the vapor deposition material such as an organic luminescent material.

Embodiment 1 discusses, as one example, a case where in a state in which the vapor deposition particle injection device 30 is provided below the film formation target substrate 200 and the film formation target surface 201 of the film formation target substrate 200 faces downward, the vapor deposition particle injection device 30 carries out vapor deposition (up deposition) of the vapor deposition particles through the apertures 11 of the mask 10 by causing the vapor deposition particles to flow upward from below.

As illustrated in FIGS. 1 and 2, the vapor deposition particle injection device 30 is configured to include a plurality of nozzle sections (a plurality of nozzle stages made of respective nozzle sections) arranged in an up-and-down direction in the vapor deposition particle injection device body (hereinafter, simply referred to as "device body") 31. The plurality of nozzle sections each are provided so as to be spaced at a predetermined interval from another nozzle section and so as to overlap another nozzle section.

The nozzle sections each provided with a plurality of apertures (through holes) penetrating each of the nozzle sections in the up-and-down direction. Further, the nozzle sections each are provided with a heat exchanger that is provided in a region surrounding each of the apertures. The heat exchanger serves as a temperature adjustment member that adjusts and controls a temperature of each of the nozzle sections.

In Embodiment 1, the nozzle sections include a vapor deposition particle emitting nozzle section 61 (cooling nozzle section) and an intermediate nozzle section 51 (intermediate temperature nozzle section). Further, below these nozzle sections, the vapor deposition particle generating section 41 is provided.

In Embodiment 1, the device body 31 includes a plurality of temperature control units (units, blocks) each of which includes a heat exchanger (temperature adjustment member) and each of which is capable of adjusting and controlling a temperature independently of another temperature control unit. The nozzle sections and the vapor deposition particle generating section 41 each are provided in a separate temperature control unit.

The temperature control units provided in Embodiment 1 are three temperature control units including, in the order from the bottom, a heating temperature control unit 40 (vapor deposition material supply unit, vapor deposition material supply section), an intermediate temperature control unit 50 (intermediate nozzle section formation unit, temperature adjusting section), and a cooling temperature control unit 60 (vapor deposition particle emitting nozzle section formation unit, vapor deposition particle injecting section).

<Configuration of Heating Temperature Control Unit 40>

The heating temperature control unit 40 that is a lowermost temperature control unit includes, as a vapor deposition particle generating section 41, a heating container 42 and a heat exchanger 43. The heating container 42 contains therein, for example, the vapor deposition material. This heating container 42 is called a crucible or a boat and has one surface (top surface) that is open. The heat exchanger 43 is provided so as to surround the heating container 42. This heat exchanger 43 heats the vapor deposition material in the heating container 42 while adjusting and controlling a temperature of the heating container 42.

The heating temperature control unit 40 heats the vapor deposition material inside the heating container 42 by use of the heat exchanger 43 so as to evaporate (in case that the vapor deposition material is a liquid material) or sublimate (in case that the vapor deposition material is a solid material) the vapor deposition material inside the heating container 42. Thereby, the heating temperature control unit 40 causes the vapor deposition material to turn into gas and consequently generates gaseous vapor deposition particles.

Note that the heat exchanger 43 can be a well-known heat exchanger such as a general heater.

The vapor deposition material turns into high-temperature vapor deposition particles when heated by the vapor deposition particle generating section 41.

The vapor deposition particle generating section 41 (more exactly, an inside of the heating container 42 heated by the heat exchanger 43) is set at a temperature higher than an evaporation temperature (in case of evaporation) or a sublimation temperature (in case of sublimation) of the vapor deposition material. The vapor deposition particle generating section 41 is set at a slightly higher temperature, for obtaining a higher film formation rate by increasing the vapor deposition particles.

When the temperature of the vapor deposition particle generating section 41 is lower than a temperature that is 10° C. higher than the temperature at which the vapor deposition material turns into gas, it is not possible to achieve a necessary film formation rate. Meanwhile, in a case where the temperature of the vapor deposition particle generating section 41 is higher than a temperature that is 100° C. higher than the temperature at which the vapor deposition material turns into gas, it is highly possible that thermal decomposition of the vapor deposition material occurs.

Note that the temperature at which the vapor deposition material turns into gas indicates an evaporation temperature (in case of evaporation) or a sublimation temperature (in case of sublimation) of the vapor deposition material.

The temperature of the vapor deposition particle generating section 41 is desirably controlled within a range of a temperature equal to or higher than a temperature that is 10° C. higher than the temperature at which the vapor deposition material turns into gas to a temperature equal to or lower than a temperature that is 100° C. higher than the temperature at which the vapor deposition material turns into gas (that is, a temperature that is 10° C. higher than the temperature at which the vapor deposition material turns into gas≤the temperature of the vapor deposition particle generating section 41≤a temperature that is 100° C. higher than the temperature at which the vapor deposition material turns into gas).

The vapor deposition material evaporated or sublimated in the heating temperature control unit 40 is discharged from an upper opening 44 and thereby supplied to a nozzle section in the intermediate temperature control unit 50.

<Configuration of Intermediate Temperature Control Unit 50>

The intermediate temperature control unit 50 is configured to include therein the intermediate nozzle section 51 as the nozzle section in the device body 31. The intermediate nozzle section 51 is provided so as to extend across the intermediate temperature control unit 50 in the intermediate temperature control unit 50. More specifically, the intermediate nozzle section 51 is provided so as to project in a direction perpendicular to a nozzle surface (aperture surface) of each of the nozzle sections.

Note that in Embodiment 1, as illustrated in FIGS. 1 and 2, the intermediate nozzle section 51 is provided at a center section of the intermediate temperature control unit 50. Further, openings 54 and 55 in the form of a depressed shape are respectively provided at a bottom and a top of the intermediate temperature control unit 50, that is, below and above the intermediate nozzle section 51.

Note that preferably, a space between the nozzle sections is as small as possible and a space in which the vapor deposition particles are scattered between the nozzle sections is not essential.

However, in Embodiment 1, the nozzle sections, further, the temperature control units each are adjusted and controlled so as to have a different temperature.

Therefore, an inner space formed by the openings each of which is provided in the form of a depressed shape in each of the temperature control units preferably has a distance of 10 mm or more in a direction perpendicular to the film formation target surface 201 of the film formation target substrate 200. In particular, a distance between the nozzle sections is preferably arranged to be 10 mm or more.

Note that edge sections of the openings of each two temperature control units which openings each have a depressed shape are preferably arranged so as to form one surface at the time when the each two temperature control units are stacked. This is for preventing the vapor deposition particles from scattering.

On this account, an edge section of the opening 54 provided at the bottom of the intermediate temperature control unit 50 is arranged so that one surface is formed by the edge section of the opening 54 and an edge section of the opening 44 at the top of the heating container 42 at the time when the intermediate temperature control unit 50 is stacked on the heating temperature control unit 40.

The intermediate nozzle section 51 is provided with a plurality of apertures 52 (through holes) penetrating the intermediate nozzle section 51 in the up-and-down direction.

Moreover, as illustrated in FIG. 2, for example, the intermediate nozzle section 51 is provided therein with a heat exchanger 53 that is provided in a region surrounding each of the apertures 52. This heat exchanger 53 adjusts and controls a temperature of the intermediate nozzle section 51.

The vapor deposition particles emitted from the opening 44 at the top of the heating container 42 first pass through an inner space in the device body 31 which inner space is formed by the opening 44 at the top of the heating container 42 and the opening 54 at the bottom of the intermediate temperature control unit 50, and then supplied to the apertures 52 provided to the intermediate nozzle section 51.

The intermediate nozzle section 51 improves linearity of a flow of the vapor deposition particles by a length of each of the apertures 52 of the intermediate nozzle section 52 (i.e., a physical nozzle length of the intermediate nozzle section 51) in a normal direction with respect to the film formation target surface 201 of the film formation target substrate 200.

However, when a temperature of a vapor deposition flow (vapor flow) is lowered at once by lowering a temperature of the nozzle section at once, the vapor deposition particles tend to be deposited on wall surfaces (nozzle wall surfaces) of the apertures 52.

The intermediate nozzle section 51 is preferably set at a temperature that is lower than a temperature of the vapor deposition particle generating section 41, because the intermediate nozzle section 51 functions to lower the temperature of the vapor deposition particles.

Therefore, the intermediate nozzle section 51 is controlled by the heat exchanger 53 so as to have a temperature that is lower than a temperature of the vapor deposition particle generating section 41 and that is higher than a temperature of the vapor deposition particle emitting nozzle section 61. In other words, the temperature relation is arranged as follows: the temperature of the vapor deposition particle generating section 41>the temperature of the intermediate nozzle section 51>the temperature of the vapor deposition particle emitting nozzle section 61.

Note that the temperature of the intermediate nozzle section 51 is not specifically limited as long as the temperature of the intermediate nozzle section 51 is lower than the temperature of the vapor deposition particle generating section 41 and between the temperature of the vapor deposition particle generating section 41 and the temperature of the vapor deposition particle generating section 41.

However, in a case where the temperature of the intermediate nozzle section 51 is equal to or lower than a temperature (evaporation temperature or sublimation temperature) at which the vapor deposition particles turn into a gas phase, the vapor deposition particles are deposited to the intermediate nozzle section 51.

On this account, the temperature of the intermediate nozzle section 51 is desirably set, in consideration of a local temperature distribution, etc., at a temperature equal to or higher than a temperature that is 5° C. higher than the temperature at which the vapor deposition particles turn into a gas phase. Therefore, the temperature of the intermediate nozzle section 51 is desirably set in a range of a temperature equal to or higher than a temperature that is 5° C. higher than the temperature at which the vapor deposition particles turn into a gas phase to a temperature that is lower than the temperature of the vapor deposition particle generating section 41.

As described above, in the vapor deposition particle injection device 30, the intermediate nozzle section 51 is provided in a path through which the vapor deposition particles generated in the vapor deposition particle generating section 41 is emitted (injected) through the apertures 62 of the vapor deposition particle emitting nozzle section 61 outward from the vapor deposition particle injection device 30. This intermediate nozzle section 51 is set at a temperature between a temperature (i.e., temperature of the heating container 42) of the vapor deposition particle generating section 41 in the heating temperature control unit 40 and a temperature of the apertures 62 of the vapor deposition particle emitting nozzle section 61.

The temperature of the vapor deposition particles is lowered, passing through the apertures 52 of the intermediate nozzle section 51. Then, the vapor deposition particles reach the vapor deposition particle emitting nozzle section 61 in the cooling temperature control unit 60.

Note that the length (nozzle length) of each of the apertures 52 of the intermediate nozzle section 51 is not specifically limited. However, the length is preferably 20 mm or more for the purpose of lowering the temperature of the vapor deposition particles.

<Configuration of Cooling Temperature Control Unit 60>

The cooling temperature control unit 60 is configured to include therein the vapor deposition particle emitting nozzle section 61 as a nozzle section in the device body 31. The vapor deposition particle emitting nozzle section 61 is provided so as to extend across the cooling temperature control unit 60 in the cooling temperature control unit 60. More specifically, the vapor deposition particle emitting nozzle section 61 is provided so as to project in the direction perpendicular to the nozzle surface (aperture surface of each of the nozzle sections.

In Embodiment 1, as illustrated in FIG. 1, the vapor deposition particle emitting nozzle section 61 is provided, for example, at a center section of the cooling temperature control unit 60. Further, openings 64 and 65 in the form of a depressed shape are respectively provided at a bottom and a top of the cooling temperature control unit 60, that is, below and above the vapor deposition particle emitting nozzle section 61.

An edge section of the opening 64 provided at the bottom of the cooling temperature control unit 60 is arranged so that one surface is formed by the edge section of the opening 64 and an edge section of the opening 54 at the top of the intermediate temperature control unit 50, at the time when the cooling temperature control unit 60 is stacked on the intermediate temperature control unit 50.

Note that as in the intermediate temperature control unit 50, in the cooling temperature control unit 60, preferably, the opening 64 in the form of a depressed shape is provided so that an inner space formed by the cooling temperature control unit 60 and an adjacent temperature control unit has a distance of 10 mm or more in a direction perpendicular to the film formation target surface 201 of the film formation target substrate 200. That is, a distance between such nozzle sections is preferably arranged to be 10 mm or more.

Note that as long as the distance of 10 mm or more is ensured between the nozzle sections, it is certainly possible to provide only either one of the openings 55 and 64.

The vapor deposition particle emitting nozzle section 61 is provided with a plurality of apertures 62 (through holes) penetrating the vapor deposition particle emitting nozzle section 61 in the up-and-down direction.

Further, as illustrated in FIG. 2, the vapor deposition particle emitting nozzle section 61 is provided therein with a heat exchanger 63 that is provided in a region surrounding each of the apertures 62. This heat exchanger 63 adjusts and controls a temperature of the vapor deposition particle emitting nozzle section 61.

Note that the heat exchangers 53 and 63 are not specifically limited as long as the heat exchangers 53 and 63 each are capable of adjusting and controlling a temperature to a desired temperature. The heat exchangers 53 and 63 each may be a well-known heat exchanger.

The vapor deposition particles having passed through the apertures 52 of the intermediate nozzle section 51 first pass through an inner space in the device body 31 which inner space is formed by the opening 55 provided at the top of the intermediate temperature control unit 50 and the opening 64 provided at the bottom of the cooling temperature control unit 60. Then, the vapor deposition particles are supplied to the apertures 62 of the vapor deposition particle emitting nozzle section 61.

The apertures 62 of the vapor deposition particle emitting nozzle section 61 serve as injection holes for injecting the vapor deposition particles outward from the vapor deposition particle injection device 30. The vapor deposition particles having passed through the apertures 62 are vapor-deposited on the film formation target surface 201 of the film formation target substrate 200 through the apertures 11 of the mask 10 that is provided above the vapor deposition particle injection device 30.

Note that as illustrated in FIGS. 1 and 3, the apertures 62 may be formed to a bottom surface of the opening 65 in the form of a depressed shape, or alternatively, as illustrated in FIG. 2, may be formed to a top surface of the device body 31 in a configuration where no opening 65 is provided.

The vapor deposition particle emitting nozzle section 61 further improves linearity of a flow of the vapor deposition particles by causing an oblique-flow component of the vapor deposition particles having passed through the apertures 52 of the intermediate nozzle section 51, to deposit on wall surfaces of the apertures 62.

The apertures 62 of the vapor deposition particle emitting nozzle section 61 is preferably arranged to have a length (nozzle length) of 20 mm or more for the purpose of blocking the oblique vapor deposition particles, though the length is not specifically limited.

The vapor deposition particle emitting nozzle section 61 is set at a temperature that is lower than a temperature (evaporation temperature or a sublimation temperature) at which the vapor deposition particles turn into a gas phase.

Note that the temperature of the vapor deposition particle emitting nozzle section 61 is not specifically limited as long as the temperature is lower than the temperature at which the vapor deposition particles turn into a gas phase. However, the temperature of the vapor deposition particle emitting nozzle section 61 is preferably set in a range of a temperature equal to or higher than a temperature that is 119° C. lower than the temperature at which the vapor deposition material turns into gas to a temperature equal to or lower than a temperature that is 5° C. lower than a temperature at which the vapor deposition material turns into gas (i.e., a temperature that is 119° C. lower than the temperature at which the vapor deposition material turns into gas≤the temperature of the vapor deposition particle emitting nozzle section 61≤a temperature that is 5° C. lower than a temperature at which the vapor deposition material turns into gas). This is for the following reasons.

In a case where each of the nozzle sections is made from nickel-plated pure copper, each of the nozzle sections has a thermal expansion coefficient of $16.8 \times 10^{-6}$° C. Here, pure copper is used as a base, because pure copper can be easily processed and makes it possible to obtain a high thermal conductivity. This pure copper is nickel-plated so that no chemical reaction occurs on a surface of each of the nozzle sections.

Assume a case where (i) a plurality of apertures are aligned in one direction in each of the nozzle sections and (ii) a distance (end-to-end distance) between centers of respective endmost apertures of each of the nozzle sections is 1 meter in a case where the above configuration is used for producing a large-size panel. Then, a change of 1° C. in temperature of a material of which each of the nozzle sections is made results in an extension of 16.8 μm in the end-to-end distance.

However, it is required that a shift amount of a position of an aperture of any of the nozzle sections from a predetermined position is required to be at the maximum 2 mm. In a case where the shift amount becomes greater than 2 mm, a positional shift between a position of the intermediate nozzle section 51 and a position of the vapor deposition particle emitting nozzle section 61 become too large when viewed from a film formation target surface 201 side of the film formation target substrate 200. This results in a shift in a direction in which the vapor deposition particles are emitted.

Therefore, it is desirable that the temperature of the vapor deposition particle emitting nozzle section 61 be equal to or higher than a temperature that is 119° C. lower than the temperature at which the vapor deposition material turns into gas. Note that there exists a material whose thermal expansion coefficient is lower for a material of each of the nozzle sections. However, such a low-thermal-expansion-coefficient material is not suitable as a material for each of the nozzle sections in view of workability and thermal conductivity.

Further, in a case where the temperature of the vapor deposition particle emitting nozzle section 61 is too close to a temperature, such as a sublimation temperature, at which the vapor deposition material turns into gas, deterioration in a vapor deposition particle adsorption effect may occur due to local temperature distribution, etc. Therefore, the temperature of the vapor deposition particle emitting nozzle section 61 is desirably equal to or lower than a temperature that is 5° C. lower than the temperature at which the vapor deposition material turns into gas.

The temperature of the apertures 52 in the intermediate nozzle section 51 is precisely controlled by the heat exchanger 53 while the temperature of the apertures 62 in the vapor deposition particle emitting nozzle section 61 is precisely controlled by the heat exchanger 63.

Embodiment 1 provides, as one example, a case where: $Alq_3$ (aluminum quinolinol complex, sublimation temperature: 305° C.) is used as the vapor deposition material; the temperature of the vapor deposition particle generating section 41 is set at 340° C.; the temperature of the intermediate nozzle section 51 is set at 320° C.; and the temperature of the vapor deposition particle emitting nozzle section 61 is set at 250° C.

Further, in Embodiment 1, the vacuum chamber 2 is preferably kept under a high vacuum condition and a vacuum (ultimate vacuum) in the vacuum chamber 2 is preferably higher than $10^{-3}$ Pa (in other words, the pressure is lower than $10^{-3}$ Pa).

When the vacuum is higher than $10^{-3}$ Pa, it is possible to achieve a necessary and sufficient value of a mean free path of the vapor deposition particles. Meanwhile, when the vacuum is equal to or lower than $10^{-3}$ Pa, the mean free path becomes shorter. Accordingly, the vapor deposition particles are scattered. This results in a deterioration in an efficiency at which the vapor deposition particles reach the film formation target substrate 200 or in a decrease in collimated components of the vapor deposition particles.

Therefore, Embodiment 1 is arranged to have an ultimate vacuum equal to or higher than $1.0 \times 10^{-4}$ Pa more in the vacuum chamber 2 (in other words, the pressure inside the vacuum chamber is arranged to be at $1.0 \times 10^{-4}$ Pa or less).

<Problems of Vapor Deposition System in which Film is Formed in State in which Film Formation Target Substrate 200 and Mask 10 are Kept Apart from Each Other>

For the purpose of explaining effects of the vapor deposition particle injection device 30, first, the following discusses problems of a vapor deposition system in which a film is vapor-deposited in a state where the film formation target substrate 200 and the mask 10 are kept apart from each other.

Figure 4:
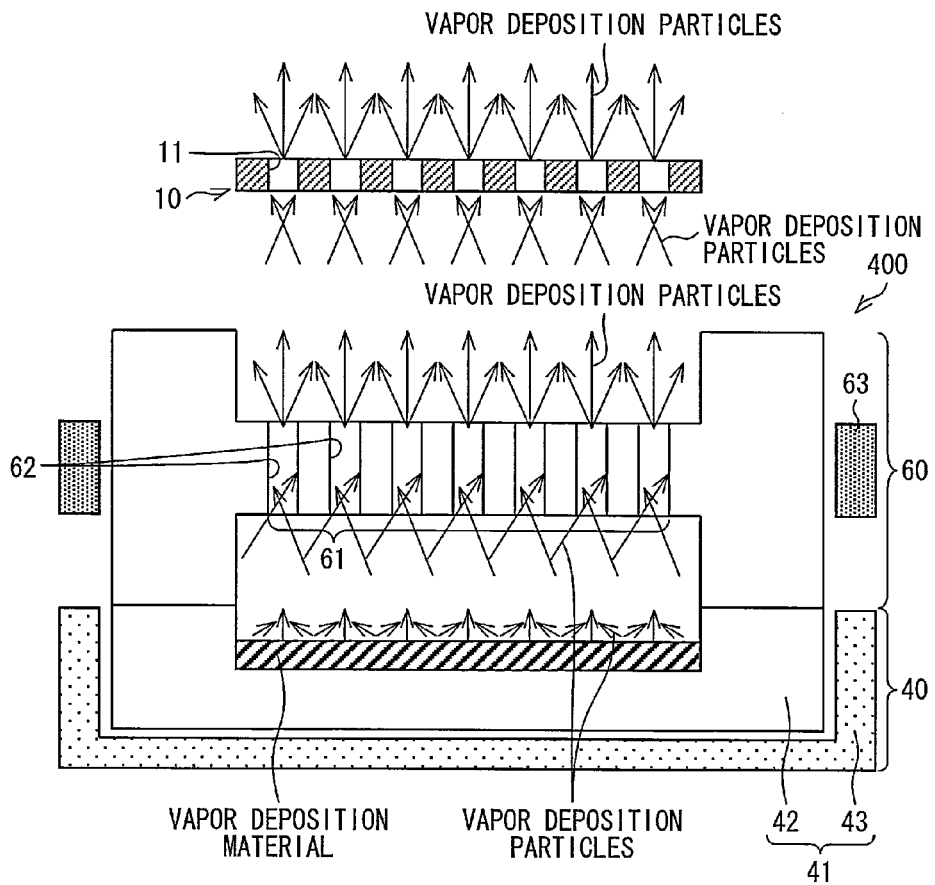

FIG. 4 is a cross sectional view schematically illustrating, for comparison, a vapor deposition particle injection device in a case where a cooling temperature control unit is provided so as to be adjacent to a heating temperature control unit.

Note that for comparison, in the vapor deposition particle injection device 400 as illustrated in FIG. 4, a cooling temperature control unit 60 having a similar structure to that of the above-described cooling temperature control unit 60 is provided so as to be adjacent to a heating temperature control unit 40 that is similar to the above-described heating temperature control unit 40 in the vapor deposition particle injection device 30.

In other words, the vapor deposition particle injection device 400 as illustrated in FIG. 4 includes a heat exchanger 43 and a heating container 42 that are similar, respectively, to the heat exchanger 43 and the heating container 42 in the heating temperature control unit 40 of the vapor deposition particle injection device 30, and a vapor deposition particle emitting nozzle section 61 above the heat exchanger 43 and the heating container 42 which vapor deposition particle emitting nozzle section 61 is similar to the vapor deposition particle emitting nozzle section 61 in the vapor deposition particle injection device 30.

Further, the vapor deposition particle injection device 400 includes a heat exchanger 63 that is similar to the heat exchanger 63 in the vapor deposition particle injection device 30. This heat exchanger 63 of the vapor deposition particle injection device 400 is provided in a region surrounding each of apertures 62 of the vapor disposition particle emitting nozzle section 61.

In a case where the cooling temperature control unit 60 is provided so as to be adjacent to the heating temperature control unit 40 as illustrated in FIG. 4, the vapor deposition particle emitting nozzle section 61 is provided close to the heating container 42. In this case, the vapor deposition particles having been emitted from the vapor deposition particle injection device 400 and having passed through apertures 11 (mask aperture pattern) in a mask 10 are scattered by the apertures 11 in the mask 10. Thus scattered vapor deposition particle adhere to the film formation target substrate 200, so that a film pattern is formed.

In this case, blurring occurs in a formed film pattern and it is not possible to form the film pattern with a predetermined accuracy. Note that this point will be more specifically discussed later with reference to a comparative experiment.

<Principle and Effects of Vapor Deposition Method of Embodiment 1>

In view of the above, a vapor deposition source of Embodiment 1 is configured such that: as illustrated in FIGS. 1 through 3, the intermediate temperature control unit 50 is provided between the heating temperature control unit 40 and the cooling temperature control unit 60; the vapor deposition particle emitting nozzle section 61 in the cooling temperature control unit 60 is set at a temperature that is lower than a temperature at which the vapor deposition material turns into gas; and the intermediate temperature control unit 50 is set at a temperature between the temperature of the vapor deposition particle generating section 41 and the temperature of the vapor deposition particle emitting nozzle section 61.

First, according to Embodiment 1, the apertures 62 that serve as injection holes for injection outward from the vapor deposition particle injection device 30 are cooled as described above so that an oblique-flow component of a vapor deposition flow is blocked.

As described above, the temperature of the vapor deposition particle emitting nozzle section 61 is set at a temperature that is lower than an evaporation temperature in a case where the vapor deposition material is evaporated or lower than a sublimation temperature in a case where the vapor deposition material is sublimated. This makes it easier to adsorb the vapor deposition particles that collide with wall surfaces of the apertures 62.

Therefore, because the vapor deposition particle emitting nozzle section 61 is cooled as described above, the vapor deposition particles of the oblique-flow component can be blocked. This allows a vapor deposition flow to be collimated.

In Embodiment 1, the intermediate nozzle section 51 is provided as described above. Accordingly, Embodiment 1 is provided with a plurality of nozzle stages made of respective aperture sections (nozzle sections) which the vapor deposition particles pass through, and thereby makes a stepwise change in temperature of the nozzle sections (gradually lowers the temperatures of the nozzle sections) during collimation of the vapor deposition flow. This makes it possible to linearize a flow of the vapor deposition particles and thereby to reduce the vapor deposition material that adheres to respective wall surfaces of the nozzle sections.

Further, as described above, the temperature of the nozzle sections is gradually lowered from an upstream side to a downstream side of the injection path for the vapor deposition particles. This makes it possible to gradually reduce the temperature of the vapor deposition particles that pass through each of the plurality of nozzle stages made of the respective nozzle sections.

Consequently, this makes it possible to locally reduce a pressure at the apertures 62 in the cooling temperature control unit 60 which apertures serve as the injection holes of the vapor deposition particle injection device 30. This makes it possible to prevent the vapor deposition particles from being scattered at the apertures 62.

Further, as described above, the temperature of the vapor deposition particle emitting nozzle section 61 is set at a temperature that is lower than a temperature at which the vapor deposition material turns into gas. This makes it possible to lower the temperature of the vapor deposition particles in the vicinity of the vapor deposition particle emitting nozzle section 61.

In this case, as described above, the temperature of the vapor deposition particles are lowered in a configuration in which the intermediate nozzle section 51 is provided between the vapor deposition particle generating section 41 and the vapor deposition particle emitting nozzle section 61 and thereby, a pressure of the vapor deposition particle emitting nozzle section 61 is reduced. This makes it possible to reduce scattering of the vapor deposition particles at the vapor deposition particle emitting nozzle section 61.

Furthermore, because the pressure in and in the vicinity of the vapor deposition particle emitting nozzle section 61 is reduced as described above, it is possible to prevent a phenomenon in which a mean free path of the vapor deposition particles becomes shorter. This allows a further improvement in collimation characteristic of a vapor deposition flow.

Meanwhile, assume a case where the vapor deposition particles in the oblique-flow component is caused to adhere to a nozzle wall surface by cooling the vapor deposition particle emitting nozzle section 61 as illustrated FIG. 4, for the purpose of enhancing a straight travelling characteristic of the vapor deposition particles as described above. In this case, when the intermediate nozzle section 51 is not provided and a temperature of the vapor deposition flow is lowered at a time by lowering the temperature of the vapor deposition particle emitting nozzle section 61 at a time, an amount of the vapor deposition particles that adhere on the nozzle wall surface increases. This tends to clog the vapor deposition particle emitting nozzle section 61.

In view of this, when the temperature of the vapor deposition particle emitting nozzle section 61 is lowered at a time in a configuration where the intermediate nozzle section 51 is not provided as illustrated in FIG. 4, it is necessary to remove the vapor deposition material having adhered to the wall surfaces of the apertures 62 of the vapor deposition particle emitting nozzle section 61 in the step of cleaning a nozzle with the use of chemical solution or the like every time a certain amount of film is formed. In an example as illustrated in FIG. 4 in which the device body is arranged as a unit, it is necessary to detach the cooling temperature control unit 60 from the vacuum chamber for such removal of the vapor deposition material.

Meanwhile, in a case where the device body is not arranged as a unit, it is required to take out the vapor deposition particle injection device itself from the vacuum chamber and disassemble the vapor deposition particle injection device.

However, according to Embodiment 1, in the vapor deposition particle emitting nozzle section 61, the vapor deposition particles hardly adhere to the wall surface of the apertures 62. This is because the vapor deposition flow is collimated by the intermediate nozzle section 51 that is a preceding nozzle stage to the vapor deposition particle emitting nozzle section 61.

Note that in Embodiment 1, as illustrated in FIGS. 1 through 3, the device body 31 is arranged as a unit. Therefore, even when the vapor deposition particles adhere to the wall surfaces of the apertures 62, it is not necessary to take out the vapor deposition particle injection device 30 from the vacuum chamber and disassemble the vapor deposition particle injection device 30.

Further, each temperature control unit is provided with a heat exchanger. Therefore, in a case where the intermediate nozzle section 51 and the vapor deposition particle emitting nozzle section 61 have an identical shape, the vapor deposition particle emitting nozzle section 61 to which the vapor deposition particles have adhered may be used as the intermediate nozzle section 51, for example, by exchanging respective positions of the cooling temperature control unit 60 and the intermediate temperature control unit 50.

In a configuration where the vapor deposition particle emitting nozzle section 61 to which the vapor deposition particles have adhered is used as the intermediate nozzle section 51 as described above and the temperature of the vapor deposition particle emitting nozzle section 61 is heated to a temperature that is higher than a temperature at which the vapor deposition material turns into gas, it is possible to reuse the vapor deposition particles that have adhered to the vapor deposition particle emitting nozzle section 61. In this case, the separate step of cleaning the nozzle with chemical solution or the like is unnecessary.

Further, in the vapor deposition particle injection device 30, each of the apertures 62 in the vapor deposition particle emitting nozzle section 61 and a corresponding one of the apertures 52 in the intermediate nozzle section 51 are formed in respective positions that overlap each other when viewed from the normal direction with respect to the film formation target surface 201 (e.g., when viewed from above the vapor deposition particle injection device 30).

As illustrated in FIG. 3, a center position of each of the apertures 52 in the intermediate nozzle section 51 is formed in the same position as a center position of a corresponding one of the apertures 62 in the vapor deposition particle emitting nozzle section 61 in the normal direction with respect to the film formation target surface 201 of the film formation target substrate 200.

In the examples illustrated in FIGS. 1 through 3, each of the apertures 62 in the vapor deposition particle emitting nozzle section 61 has the same diameter as a corresponding aperture 52 in the intermediate nozzle section 51. Each of the apertures 62 in the vapor deposition particle emitting nozzle section 61 and a corresponding one of the apertures 52 in the intermediate nozzle section 51 are formed so as to be in the same position when viewed from the normal direction with respect to the film formation target surface 201.

In this way, the apertures 62 in the vapor deposition particle emitting nozzle section 61 and the apertures 52 in the intermediate nozzle section 51 are formed in positions that allow each of the apertures 62 to overlap with a corresponding one of the apertures 52. This makes it possible to improve a collimation characteristic of the vapor deposition flow.

Further, in the configuration where each of the apertures 62 in the vapor deposition particle emitting nozzle section 61 and a corresponding one of the apertures 52 in the intermediate nozzle section 51 are formed in positions that allow each of the apertures 62 to overlap with a corresponding one of the apertures 52, an apparent length (aperture length, nozzle length) of the apertures of the nozzle sections in the normal direction with respect to the film formation target surface 201 can be increased. This makes it possible to collimate the vapor deposition flow due to an effect of the nozzle length.

As described above, in Embodiment 1, the vapor deposition particles are injected from the vapor deposition particle injection device 30 and reaches the mask 10, and a direction in which the vapor deposition particles travel from the vapor deposition particle injection device 30 to the mask 10 is arranged to be parallel to (that is, a flow of the vapor deposition particles is collimated along) the normal direction with respect to the film formation target surface 201 of the film formation target substrate 200 (i.e., the normal direction with respect to the mask surface of the mask 10).

Accordingly, the vapor deposition particles that are travelling in a direction perpendicular to the mask surface of the mask 10 pass through the apertures 11 of the mask 10 and then adhere to the film formation target substrate 200 in conformity with the mask pattern (i.e., in conformity with a shape of the apertures 11). This eliminates blurring of a formed film pattern and makes it possible to form a film pattern with a high accuracy.

The following discusses a method of forming a film pattern by use of the vapor deposition apparatus 1, that is, as an example vapor deposition method of the present embodiment, a method for producing an organic EL display device that (i) is of a bottom emission type, that is, extracts light from a TFT substrate side, and that (ii) carries out an RGB full color display.

<Overall Arrangement of Organic EL Display Device>

Figure 5:
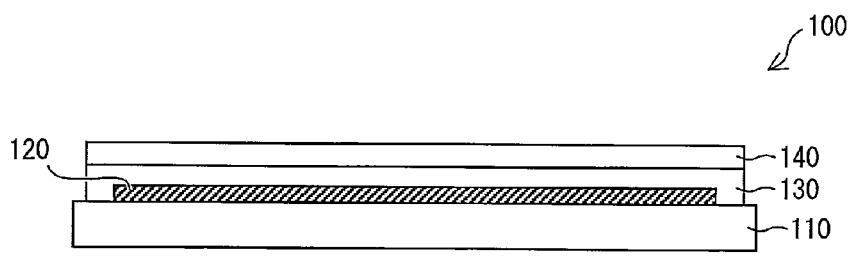

FIG. 5 is a cross sectional view schematically illustrating a configuration of the organic EL display device.

As illustrated in FIG. 5, an organic EL display device 100 includes a TFT (thin film transistor) substrate 110, an organic EL element 120, an adhesive layer 130, and a sealing substrate 140.

On the TFT substrate 110, TFTs or the like are each formed as a switching element in a part that serves as a pixel region.

The organic EL element 120 is plurally formed in a matrix manner in a display region of the TFT substrate 110.

The TFT substrate 110 on which organic EL elements 120 are formed is bonded to the sealing substrate 140 by the adhesive layer 130, or the like.

The following describes in detail respective configurations of the TFT substrate 110 and each of the organic EL elements 120 both included in the organic EL display device 100.

<Configuration of TFT Substrate 110>

Figure 6:
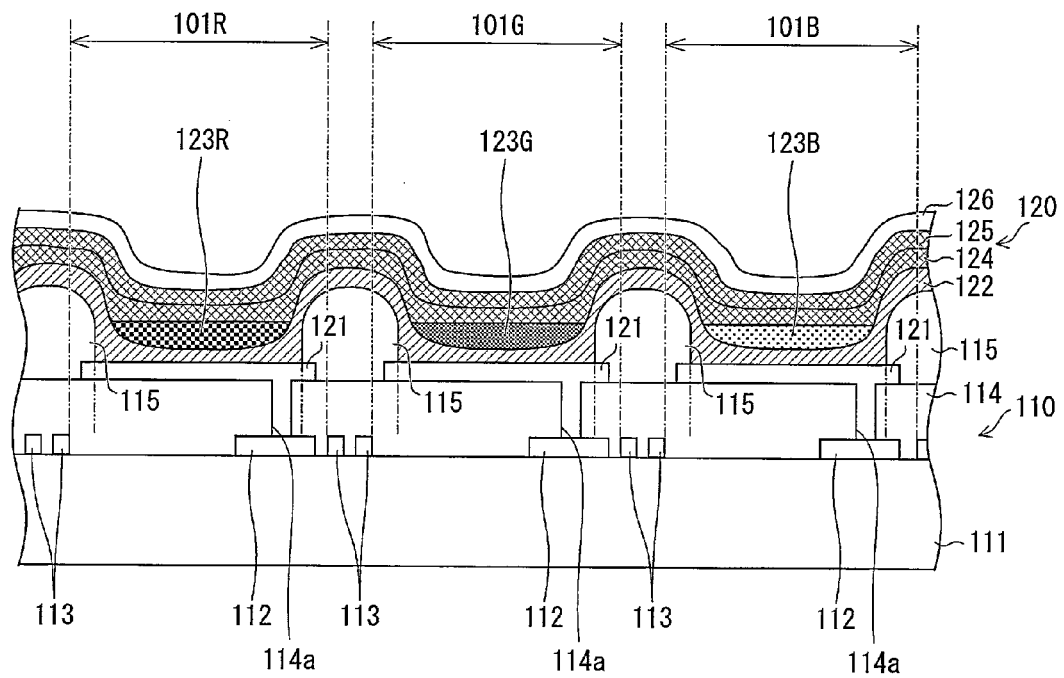

FIG. 6 is a cross sectional view schematically illustrating a configuration of the organic EL elements 120 constituting a display section of the organic EL display device 100.

The TFT substrate 110, as illustrated in FIG. 6, includes on a transparent insulating substrate 111 such as a glass substrate: TFTs 112 (switching elements); wires 113; an interlayer film 114; an edge cover 115; and the like.

The organic EL display device 100 is a full-color active matrix organic EL display device. The organic EL display device 100 includes, on the insulating substrate 111 and in regions defined by the wires 113, pixels 101R, 101G, and 101B arranged in a matrix manner which include organic EL elements 120 of red (R), green (G), and blue (B), respectively.

The TFTs 112 are provided so as to correspond respectively to the pixels 101R, 101G, and 101B. Since the configuration of a TFT has conventionally been well-known, the individual layers of a TFT 112 are not illustrated in the drawings or described herein.

The interlayer insulating film 114 is provided on the insulating substrate 111 throughout the entire region of the insulating substrate 111 to cover the TFTs 112 and the wires 113.

There are provided on the interlayer insulating film 114 first electrodes 121 of the organic EL elements 120.

The interlayer insulating film 114 has contact holes 114a for electrically connecting the first electrodes 121 of the organic EL elements 120 to the TFTs 112. This electrically connects the TFTs 112 to the organic EL elements 120 via the contact holes 114a.

The edge cover 115 is an insulating layer for preventing the first electrode 121 and a second electrode 126 of a corresponding one of the organic EL elements 120 from short-circuiting with each other due to, for example, (i) a reduced thickness of an organic EL layer in an edge section of the first electrode 121 or (ii) an electric field concentration.

The edge cover 115 is so formed on the interlayer insulating film 114 as to cover edge sections of the first electrode 121.

As illustrated in FIG. 6, the first electrode 121 is exposed in an area where the first electrode 121 is not covered with the edge cover 115. This area that is exposed serves as a light-emitting section of each of the pixels 101R, 101G, and 101B.

The pixels 101R, 101G, and 101B are, in other words, isolated from one another by the insulating edge cover 115. The edge cover 115 thus functions as an element isolation film as well.

<Production Method of TFT Substrate 110>

The insulating substrate 111 can be made of, for example, alkali-free glass or plastic. Embodiment 1 employs an alkali-free glass substrate having a thickness of 0.7 mm.

A known photosensitive resin can be used for each of the interlayer insulating film 114 and the edge cover 115. Examples of such a known photosensitive resin encompass an acrylic resin and a polyimide resin.

Further, the TFTs 112 are fabricated by a known method. Embodiment 1 describes, as an example, the active matrix organic EL display device 100 in which the TFTs 112 are respectively formed in the pixels 101R, 101G and 101B, as described above.

However, Embodiment 1 is not limited to such a configuration. The present invention is also applicable to production of a passive matrix organic EL display device in which any TFT is not formed.

<Configuration of Organic EL Elements 120>

The organic EL element 120 is a light-emitting element capable of high-luminance light emission based on low-voltage direct-current driving, and includes: the first electrode 121; the organic EL layer; and the second electrode 126, provided on top of one another in that order.

The first electrode 121 is a layer having the function of injecting (supplying) positive holes into the organic EL layer. The first electrode 121 is, as described above, connected to the TFTs 112 via the contact holes 114a.

The organic EL layer provided between the first electrode 121 and the second electrode 126 includes, for example, as illustrated in FIG. 6: a hole injection layer/hole transfer layer 122; luminescent layers 123R, 123G, and 123B; an electron transfer layer 124; and an electron injection layer 125, formed in that order from the first electrode 121 side.

Note that the organic EL layer can, as needed, further include a carrier blocking layer (not illustrated) for blocking a flow of carriers such as holes and electrons. Further, a single layer can have a plurality of functions. For example, a single layer that serves as both a hole injection layer and a hole transfer layer may be formed.

The above stack order intends to use (i) the first electrode 121 as an anode and (ii) the second electrode 126 as a cathode. The stack order of the organic EL layer is reversed in the case where the first electrode 121 serves as a cathode and the second electrode 126 serves as an anode.

The hole injection layer has the function of increasing efficiency in injecting positive holes into the organic EL layer from the first electrode 121. The hole transfer layer has the function of increasing efficiency in transferring positive holes to the luminescent layers 123R, 123G, and 123B. The hole injection layer/hole transfer layer 122 is so formed uniformly throughout the entire display region of the TFT substrate 110 as to cover the first electrode 121 and the edge cover 115.

The present embodiment is configured to involve, as the hole injection layer and the hole transfer layer, a hole injection layer/hole transfer layer 122 that integrally combines a hole injection layer with a hole transfer layer as described above. The present embodiment is, however, not limited to such an arrangement. The hole injection layer and the hole transfer layer may be provided as separate layers independent of each other.

There are provided on the hole injection layer/hole transfer layer 122 the luminescent layers 123R, 123G, and 123B formed in correspondence with the respective pixels 101R, 101G, and 101B.

The luminescent layers 123R, 123G, and 123B are each a layer that has the function of emitting light by recombining (i) positive holes injected from the first electrode 121 side with (ii) electrons injected from the second electrode 126 side. The luminescent layers 123R, 123G, and 123B are each made of a material with high luminous efficiency, such as a low-molecular fluorescent dye and a metal complex.

The electron transfer layer 124 is a layer that has the function of increasing efficiency in transferring electrons to the luminescent layers 123R, 123G, and 123B. The electron injection layer 125 is a layer that has the function of increasing efficiency in injecting electrons from the second electrode 126 into the organic EL layer.

The electron transfer layer 124 is so provided on the luminescent layers 123R, 123G, and 123B and the hole injection layer/hole transfer layer 122 uniformly throughout the entire display region of the TFT substrate 110 as to cover the luminescent layers 123R, 123G, and 123B and the hole injection layer/hole transfer layer 122.

The electron injection layer 125 is so provided on the electron transfer layer 124 uniformly throughout the entire display region of the TFT substrate 110 as to cover the electron transfer layer 124.

The electron transfer layer 124 and the electron injection layer 125 may be provided either (i) as separate layers independent of each other as described above or (ii) integrally with each other. In other words, the organic EL display device 100 may include an electron transfer layer/electron injection layer instead of the electron transfer layer 124 and the electron injection layer 125.

The second electrode 126 is a layer having the function of injecting electrons into the organic EL layer including the above organic layers. The second electrode 126 is so provided on the electron injection layer 125 uniformly throughout the entire display region of the TFT substrate 110 as to cover the electron injection layer 125.

The organic layers other than the luminescent layers 123R, 123G, and 123B are not essential for the organic EL layer, and may thus be included as appropriate in accordance with a required property of the organic EL element 120.

Further, like the hole injection layer/hole transfer layer 122 and the electron transfer layer/electron injection layer, a single layer can have a plurality of functions.

The organic EL layer may further include a carrier blocking layer according to need. The organic EL layer can, for example, additionally include, as a carrier blocking layer, a hole blocking layer between the luminescent layers 123R, 123G, and 123B and the electron transfer layer 124 to prevent positive holes from transferring from the luminescent layers 23R, 23G, and 23B to the electron transfer layer 124 and thus to improve luminous efficiency.

<Method for Producing Organic EL Element 120>

The first electrodes 121 are formed by (i) depositing an electrode material by a method such as sputtering and (ii) then patterning the electrode material in shapes for respective pixels 101R, 101G, and 101B by photolithography and etching.

The first electrodes 121 can be made of any of various electrically conductive materials. Note, however, that the first electrodes 121 need to be transparent or semi-transparent in a case where the organic EL display device 100 includes a bottom emission organic EL element in which light is emitted towards an insulating substrate 111 side.

Meanwhile, a second electrode 126 needs to be transparent or semi-transparent in a case where the organic EL display device 100 includes a top emission organic EL element in which light is emitted from a side opposite to the substrate side.

The conductive film material for each of the first electrode 121 and the second electrode 126 is, for example, (i) a transparent conductive material such as ITO (Indium Tin Oxide), IZO (indium zinc oxide), and gallium-added zinc oxide (GZO) or (ii) a metal material such as gold (Au), nickel (Ni), and platinum (Pt).

The above conductive film can be formed by, instead of the sputtering method, a method such as a vacuum vapor deposition method, a chemical vapor deposition (CVD) method, a plasma CVD method, and a printing method. For example, the vapor deposition apparatus 1 described later can be used for formation of layers of the first electrode 121.

The organic EL layer can be made of a known material. Note that each of the luminescent layers 123R, 123G, and 123B can be made of a single material or made of a host material mixed with another material as a guest material or a dopant.

The hole injection layer, the hole transfer layer, or the hole injection layer/hole transfer layer 122 can be made of a material such as (i) anthracene, azatriphenylene, fluorenone, hydrazone, stilbene, triphenylene, benzine, styryl amine, triphenylamine, porphyrin, triazole, imidazole, oxadiazole, oxazole, polyarylalkane, phenylenediamine, arylamine, or a derivative of any of the above, or (ii) a monomer, an oligomer, or a polymer of an open chain conjugated system or cyclic conjugated system, such as a thiophene compound, a polysilane compound, a vinylcarbazole compound, or an aniline compound.

The luminescent layers 123R, 123G, and 123B are each made of a material, such as a low-molecular fluorescent pigment or a metal complex, that has high light emission efficiency. For example, the luminescent layers 123R, 123G, and 123B are each made of a material such as anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, a derivative of any of the above, a tris(8-hydroxyquinolinate) aluminum complex, a bis(benzohydroxyquinolinate) beryllium complex, a tri(dibenzoylmethyl) phenanthroline europium complex, ditoluyl vinyl biphenyl, hydroxyphenyl oxazole, or hydroxyphenyl thiazole.

The electron transfer layer 124, the electron injection layer 125, or the electron transfer layer/electron injection layer can be made of a material such as a tris(8-hydroxyquinolinate) aluminum complex, an oxadiazole derivative, a triazole derivative, a phenylquinoxaline derivative, or a silole derivative.

<Method for Forming Film Pattern by Vacuum Vapor Deposition Method>

Figure 7:
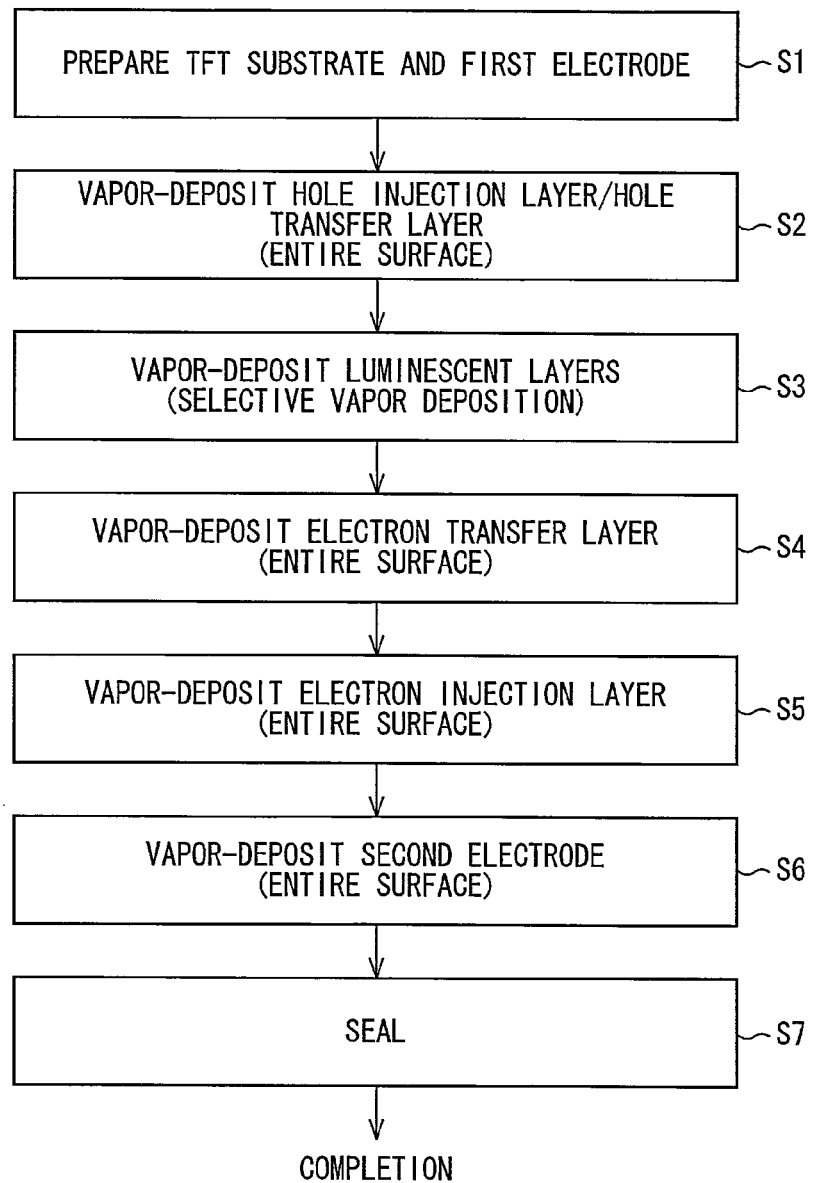

The following discusses a method for forming a film pattern by a vacuum vapor deposition method, mainly with reference to FIG. 7.

Note that the following description deals with an example case where: the TFT substrate 110 is used as the film formation target substrate 200; an organic luminescent material is used as the vapor deposition material; and an organic EL layer is formed as a vapor-deposited film, by the vacuum vapor deposition method, on the film formation target substrate 200 on which the first electrode 121 is formed.

As described above, the organic EL display device 100 that is a full-color organic display device includes, for example, the pixels 101R, 101G, and 101B arranged in a matrix manner, which pixels 101R, 101G, and 101B are respectively made of the organic EL elements 120 of red (R), green (G), and blue (B) that include the luminescent layers 123R, 123G, and 123B, respectively.

Note that the organic EL elements 120 may alternatively include, for example, luminescent layers of cyan (C), magenta (M), and yellow (Y), respectively, or luminescent layers of red (R), green (G), blue (B), and yellow (Y), respectively, in place of the luminescent layers 123R, 123G, and 123 B of red (R), green (G), and blue (B).

Such an organic EL display device 100 performs a color image display by selectively causing the organic EL element 120 to emit light at a desired luminance by use of the TFTs 112.

Therefore, for producing the organic EL display device 100, it is required to form, on the film formation target substrate 200, the luminescent layers that are made of organic luminescent materials emitting respective colors. At this time, the luminescent layers each need to be formed in a predetermined pattern for each organic EL element 120.

As described above, in the mask 10, the apertures 11 each are formed in a desired shape at a desired position. As illustrated in FIGS. 1 through 3, the mask 10 is provided so as to face the film formation target surface 201 of the film formation target substrate 200 via a space of a predetermined distance.

On an opposite side of the mask 10 with respect to the film formation target substrate 200, the vapor deposition particle injection device 30 is provided as a vapor deposition source so as to face the film formation target surface 201 of the film formation target substrate 200.

When the organic EL display device 100 is to be produced, the organic luminescent material is heated under high vacuum so that the organic luminescent material turned into gas by evaporation or sublimation, and then injected from the vapor deposition particle injection device 30 in the form of the vapor deposition particle in a gas phase.

The vapor deposition material injected as the vapor deposition particles from the vapor deposition particle injection device 30 is vapor-deposited onto the film formation target substrate 200 through the apertures 11 provided in the mask 10.

This makes it possible to form, as a vapor-deposited film, an organic film having a desired film pattern only in a desired position, corresponding to each of the apertures 11, on the film formation target substrate 200. Note that the vapor deposition is separately carried out for each color of the luminescent layers (This is called a "selective vapor deposition").

For example, in case of the hole injection layer/hole transfer layer 122 as illustrated in FIG. 6, a film is formed throughout an entire area of the display section. Therefore, film formation is carried out by using, as the mask 10 for vapor deposition, an open mask that has an opening only in positions corresponding to the entire area of the display section and a region where film formation is required.

Note that the same applies to the electron transfer layer 124, the electron injection layer 125, and the second electrode 126.

Meanwhile, film formation is carried out for the luminescent layer 123R of a pixel in FIG. 6 that performs a red display, film formation is carried out by using, as the mask 10 for vapor deposition, a fine mask which has an opening only in a position corresponding to a region where a red luminescent material is to be vapor-deposited.

<Process Flow in Production of Organic EL Display Device>

FIG. 7 is a flowchart illustrating a production process of the organic EL display device 100 in the order of steps.

First, the TFT substrate 110 is prepared. On thus prepared TFT substrate 110, the first electrode 121 is formed (step S1). Note that the TFT substrate 110 can be prepared by a known technique.

Then, on this TFT substrate 110 on which the first electrode 121 is formed, the hole injection layer and the hole transfer layer are formed throughout an entire pixel region by the vacuum vapor deposition method, with use of an open mask as the mask 10 for vapor deposition (step S2). Note that the hole injection layer and the hole transfer layer can alternatively be formed as the hole injection layer/hole transfer layer 122 as described above.

Next, selective vapor deposition of each of the luminescent layers 123R, 123G, and 123B is carried out by the vacuum vapor deposition method with use of a fine mask as the mask 10 for vapor deposition (step S3). Thereby, patterned films are formed so as to correspond to the pixels 101R, 101G, 101B, respectively.

Subsequently, on the TFT substrate 110 on which the luminescent layers 123R, 123G, and 123B are formed, the electron transfer layer 124, the electron injection layer 125, and the second electrode 126 each are formed in this order throughout the entire pixel region by the vacuum vapor deposition method, with use of an open mask as the mask 10 for vapor deposition (steps S4 to S6).

For the TFT substrate 110 on which vapor deposition has been completed as described above, sealing of a region (display section) of the organic EL elements 120 is performed so as to prevent the organic EL elements 120 from deteriorating due to moisture or oxygen in the air (step S7).

This sealing can be performed, for example, by a method in which a film that does not easily allow moisture and oxygen to pass through the film, or a method in which a glass substrate or the like is bonded with an adhesive or the like. The organic EL display device 100 is prepared in the process as described above. Such an organic EL display device 100 causes current to flow into the organic EL elements 120 in respective individual pixels from an externally provided drive circuit so that the organic EL elements 120 emit light. Thereby, the organic EL display device 100 performs a desired display.

<Experimental Comparison of Formed Film Patterns (Comparative Experiment)>

Next, a comparison was made between (a) an accuracy of a formed film pattern that was actually obtained in a case where the vapor deposition particle injection device 30 illustrated in FIG. 1 was used as a vapor deposition source and (b) an accuracy of a formed film pattern that was actually obtained in a case where the vapor deposition particle injection device 400 illustrated in FIG. 4 was used as a vapor deposition source.

For an experiment, the vapor deposition particle injection device 30 illustrated in FIG. 1 and the vapor deposition particle injection device 400 illustrated in FIG. 4 (described earlier) were used as vapor deposition sources, and the comparison was carried out under an identical condition except that the vapor deposition particle injection device 30 was provided with the intermediate temperature control unit 50.

Note that a green luminescent material such as Alga (aluminum quinolinol complex) (having a sublimation temperature of 305° C.) to be used for, for example, a host material of the green luminescent layer 123G was used as the vapor deposition material, and a single film of $Alq_3$ was in-line formed on a silicon wafer so as to have a thickness of 100 nm.

A separation distance between the film formation target substrate 200 and the mask 10 in the direction perpendicular to the film formation target surface 201 of the film formation target substrate 200 was set to 1 mm. Further, a separation distance between the vapor deposition particle injection device 30 or 400 and the mask 10 in the direction perpendicular to the film formation target surface 201 of the film formation target substrate 200 was set to 125 mm.

An ultimate vacuum in the vacuum chamber 2 was set to be equal to or lower than $1.0 \times 10^{-4}$ Pa. As described earlier, in the vapor deposition particle injection device 30 illustrated in FIG. 1, the temperature of the vapor deposition particle generating section 41 was set at 340° C.; the temperature of the intermediate nozzle section 51 was set at 320° C.; and the temperature of the vapor deposition particle emitting nozzle section 61 was set at 250° C.

Further, also in the vapor deposition particle injection device 400 illustrated in FIG. 4, the temperature of the vapor deposition particle generating section 41 was set at 340° C., and the temperature of the vapor deposition particle emitting nozzle section 61 was set at 250° C.

Note that an aperture length (nozzle length) of each of the nozzle sections was set to 20 mm and that a space between the nozzle sections in the direction perpendicular to the film formation target surface 201 of the film formation target substrate 200 was set to 10 mm.

Figure 8:
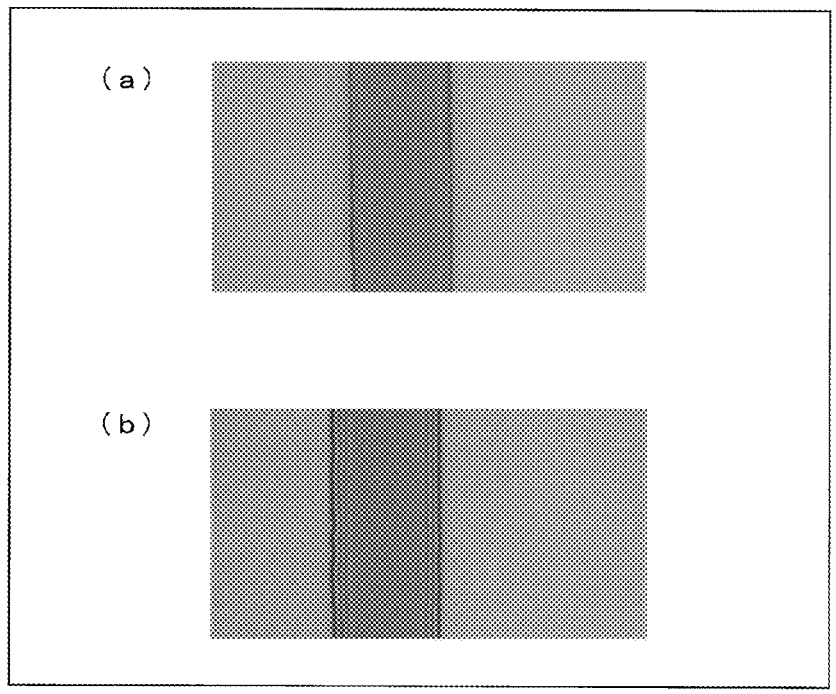

(a) and (b) of FIG. 8 show results of observation of obtained formed film patterns by use of an optical microscope.

(a) of FIG. 8 is a diagram showing an optical micrograph of a formed film pattern obtained by using, as a vapor deposition source, the vapor deposition particle injection device 30 illustrated in FIG. 1; and (b) of FIG. 8 is a diagram showing an optical micrograph of a formed film pattern obtained by using, as a vapor deposition source, the vapor deposition particle injection device 400 illustrated in FIG. 4.

In a case where a vapor deposition flow contain an oblique-flow component while passing through the apertures 11 in the mask 10, an obtained pattern has, in an end section of the obtained pattern, a sloping part (part in which film thickness is varying) formed by vapor deposition particles having obliquely passed through the apertures 11 in the mask 10.

In a case where the vapor deposition particle injection device 400 is used as a vapor deposition source, as illustrated in (b) of FIG. 8, the part in which film thickness is varying can be seen as a multiplet in a width direction of the obtained pattern, and it is shown that a width of the part in which film thickness is varying, i.e., a width of a part which extends beyond an intended region where a film pattern is to be formed is much larger than that illustrated in (a) of FIG. 8.

This reveals that a large pattern blur occurs in the obtained formed film pattern (see (b) of FIG. 8) in a case where the vapor deposition particle injection device 400 is used as a vapor deposition source, whereas the pattern blur is reduced in (a) of FIG. 8 as compared to that in (b) of FIG. 8 (see (a) of FIG. 8) in a case where the vapor deposition particle injection device 30 is used as a vapor deposition source.

This reveals that the use of the vapor deposition particle injection device 30 of Embodiment 1 as a vapor deposition source makes it possible to produce a high quality display panel.

<Modification of Substrate Moving Unit 3>

Note that Embodiment 1 has discussed, as an example with reference to the drawings, a case where the film formation target substrate 200 is placed on the substrate moving unit 3 (see FIG. 2). However, Embodiment 1 is not limited to such an example.

The substrate moving unit 3 preferably includes, for example, an electrostatic chuck (not illustrated). For example, in a case where a non-film-formation-target surface 202 of the film formation target substrate 200 is held, by use of a method such as an electrostatic chuck, by the substrate moving unit 3 provided on the non-film-formation-target surface 202 side of the film formation target substrate 200, the film formation target substrate 200 can be held by the substrate moving unit 3 without being bent by self weight.

<Modification of Heating Temperature Control Unit 40>

Embodiment 1 has discussed, as an example, a case where: the heating temperature control unit 40 includes the heating container 42 as the vapor deposition particle generating section 41, which heating container 42 contains therein the vapor deposition material, is called a crucible or a boat, and has one surface (top surface) that is open; and the vapor deposition material is directly contained in the heating container 42 and turned into gas by being evaporated or sublimated (see FIGS. 1 and 2).

However, Embodiment 1 is not limited to such an example. For example, Embodiment 1 may also be configured such that the vapor deposition particle generating section 41 is provided with a load lock pipe (not illustrated) and the vapor deposition material in a gas phase is supplied, by use of the load lock pipe heated, to the vapor deposition particle generating section from a vapor deposition material container (not illustrated) such as a tank which is provided outside the vacuum chamber and which uses a heating mechanism.

<Down Deposition>

Embodiment 1 has discussed, as an example, a case where in a state in which the vapor deposition particle injection device 30 is provided below the film formation target substrate 200, the vapor deposition particle injection device 30 carries out up deposition of the vapor deposition particles through the apertures 11 in the mask 10 by causing the vapor deposition particles to flow upward from below (described earlier). However, Embodiment 1 is not limited to such an example.

For example, Embodiment 1 may also be configured such that in a state in which the vapor deposition particle injection device 30 is provided above the film formation target substrate 200 by changing an arrangement of the substrate moving unit 3, the mask moving unit 4, the shutter operation unit 5, and the vapor deposition particle injection device shifting unit 20 (turning the arrangement illustrated in each of FIGS. 1 through 3 upside down), the vapor deposition particle injection device 30 carries out vapor deposition (down deposition) of the vapor deposition particles through the apertures 11 in the mask 10 by causing the vapor deposition particles to flow downward from above.

Note that, in a case where down deposition is carried out as described above, for example, instead of directly containing the vapor deposition material in the heating container 42 of the vapor deposition particle injection device 30 and heating the vapor deposition material, the heating temperature control unit 40 should be provided with, for example, a load lock pipe so that, through the load lock pipe, the vapor deposition material evaporated or sublimated is injected (described earlier).

In a case where vapor deposition is carried out by down deposition in this way, a high-definition pattern can be formed with a high accuracy all over the film formation target substrate 200 even if no method such as an electrostatic chuck is used to suppress bending of the film formation target substrate 200 by self weight.

<Side Deposition>

Alternatively, the vapor deposition particle injection device 30 may be configured to include, for example, a mechanism that injects the vapor deposition particles in a transverse direction. Then, the vapor deposition particle injection device 30 may carry out vapor deposition (side deposition) of the vapor deposition particles in the transverse direction through the mask 10 onto the film formation target substrate 200 in a state in which the film formation target surface 201 of the film formation target substrate 200 stands upright so as to face the vapor deposition particle injection device 30.

Note that, also in a case where side deposition is carried out as described above, for example, instead of directly containing the vapor deposition material in the heating container 42 of the vapor deposition particle injection device 30 and heating the vapor deposition material, the heating temperature control unit 40 should be provided with, for example, a load lock pipe so that through the load lock pipe, the vapor deposition material evaporated or sublimated are injected.

<Aperture Area of Nozzle Section>

The examples illustrated in FIGS. 1 through 3 have discussed, as an example, a case where the apertures 62 in the vapor deposition particle emitting nozzle section 61 and the apertures 52 in the intermediate nozzle section 51 are identical in diameter. However, Embodiment 1 is not limited to such a configuration.

Figure 9:
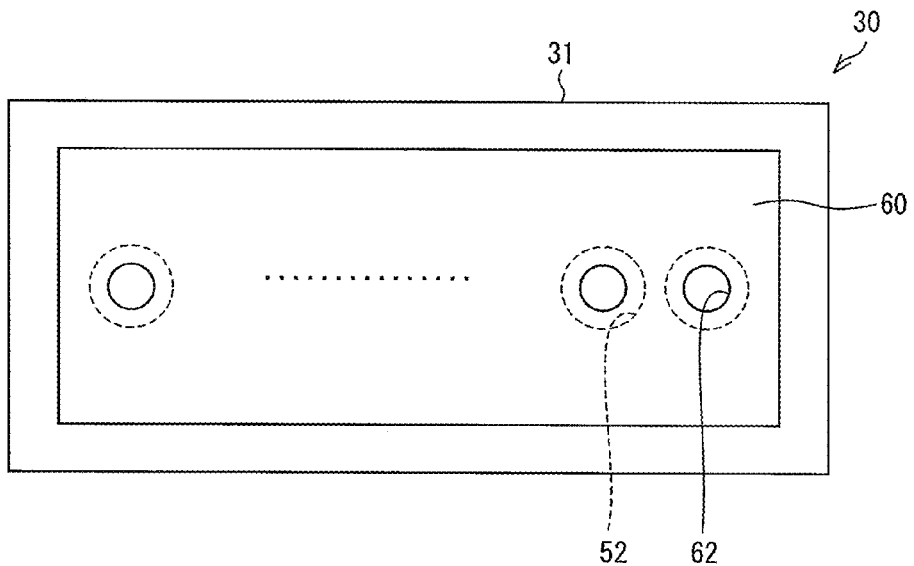

FIG. 9 is a plan view schematically illustrating one example of an outline configuration of a substantial part of the vapor deposition particle injection device 30 according to Embodiment 1. Note that in FIG. 9, the apertures 52 in the intermediate nozzle section 51 are indicated by dotted lines and not all the apertures 62 in the vapor deposition particle emitting nozzle section 61 and the apertures 52 in the intermediate nozzle section 51 are illustrated.

As illustrated in FIG. 9, an area (aperture area) of each of the apertures 52 in the intermediate nozzle section 51 may be configured to be larger than an area (aperture area) of a corresponding one of the apertures 62 in the vapor deposition particle emitting nozzle section 61, when viewed from the normal direction with respect to the film formation target surface 201 of the film formation target substrate 200.

In other words, a diameter of each of the apertures 52 in the intermediate nozzle section 51 may be configured to be larger than a diameter of a corresponding one of the apertures 62 in the vapor deposition particle emitting nozzle section 61, when viewed from the normal direction with respect to the film formation target surface 201 of the film formation target substrate 200.

Further, for improvement of a film thickness distribution, the apertures may have different shapes (nozzle shapes) in a single nozzle stage made of the nozzle section.

Other Modifications

Embodiment 1 has discussed, as an example, a case where only one nozzle stage made of the intermediate nozzle section 51 is provided. However, Embodiment 1 is not limited to such an example, and a plurality of nozzle stages each made of the intermediate nozzle section 51 may be provided.

Note that, in a case where the plurality of nozzle stages each made of the intermediate nozzle section 51 are provided as described above, an aperture of each of the plurality of nozzle stages each made of the intermediate nozzle section 51 may have a shape which is identical, or different (as shown in another embodiment that will be described later).

Note also that, in a case where the plurality of nozzle stages each made of the intermediate nozzle section 51 are provided, a temperature of each of the plurality of nozzle stages each made of the intermediate nozzle section 51 may be identical, or different (as shown in another embodiment that will be described later).

In any of the cases, a greater collimation effect yielded by a nozzle length can be obtained by providing the plurality of nozzle stages each made of the intermediate nozzle section 51 as described above.

Note that FIG. 3 exemplifies a case where the apertures 11 in the mask 10 are arranged in a one-dimensional direction (i.e., in a line) and the apertures 62 serving as injection holes of the vapor deposition particle injection device 30 are also arranged in a one-dimensional direction. However, Embodiment 1 is not limited to such a case, and the apertures 11 in the mask 10 may be two-dimensionally (i.e., planarly) arranged and the injection holes of the vapor deposition particle injection device 30 may also be two-dimensionally arranged.

Embodiment 1 has described an example case in which (i) the organic EL display device 100 includes a TFT substrate 110 and (ii) an organic layer is formed on the TFT substrate 110. The present invention is, however, not limited to such an arrangement. The present invention may alternatively be arranged such that (i) the organic EL display device 100 includes not a TFT substrate 110 but, as a substrate on which an organic layer is to be formed, a passive substrate including no TFT, or that (ii) the film formation target substrate 200 is such a passive substrate.

Embodiment 1 has described an example case of, as described above, forming an organic layer on a TFT substrate 110. Embodiment 1 is, however, not limited to such an arrangement. Embodiment 1 is suitably applicable to a case of forming an electrode pattern instead of an organic layer.

Note that, as a material of which units and nozzle sections for use in the vapor deposition particle injection device 30 are made, a material which is free from deterioration and deformation caused by heating or cooling of each of the nozzle sections may be selected as appropriate in accordance with a kind of the vapor deposition material, particularly in accordance with a temperature at which the vapor deposition material turns into gas. Such a material is not specifically limited. The material of which units and nozzle sections for use in the vapor deposition particle injection device 30 are made encompasses, for example, a material of which a publicly-known vapor deposition source such as a crucible is made.

The vapor deposition particle injection device 30 and the vapor deposition apparatus 1, and the vapor deposition method according to Embodiment 1 are, as described above, suitably applicable to not only the method for producing the organic EL display device 100 but also any production method and production device for forming a patterned film by vapor deposition.

For example, the vapor deposition particle injection device 30 and the vapor deposition apparatus 1, and the vapor deposition method according to Embodiment 1 are suitably applicable not only to the organic EL display device 100 but also to, for example, production of a functional device such as an organic thin-film transistor.

Embodiment 2

Embodiment 2 is described below mainly with reference to FIGS. 10 through 12.

Embodiment 2 mainly deals with how Embodiment 2 is different from Embodiment 1 above. Constituent elements of Embodiment 2 that are identical in function to their respective equivalents described in Embodiment 1 are each assigned the same reference numeral, and are not described here.

<Configuration of Vapor Deposition Particle Injection Device 30>

Figure 10:
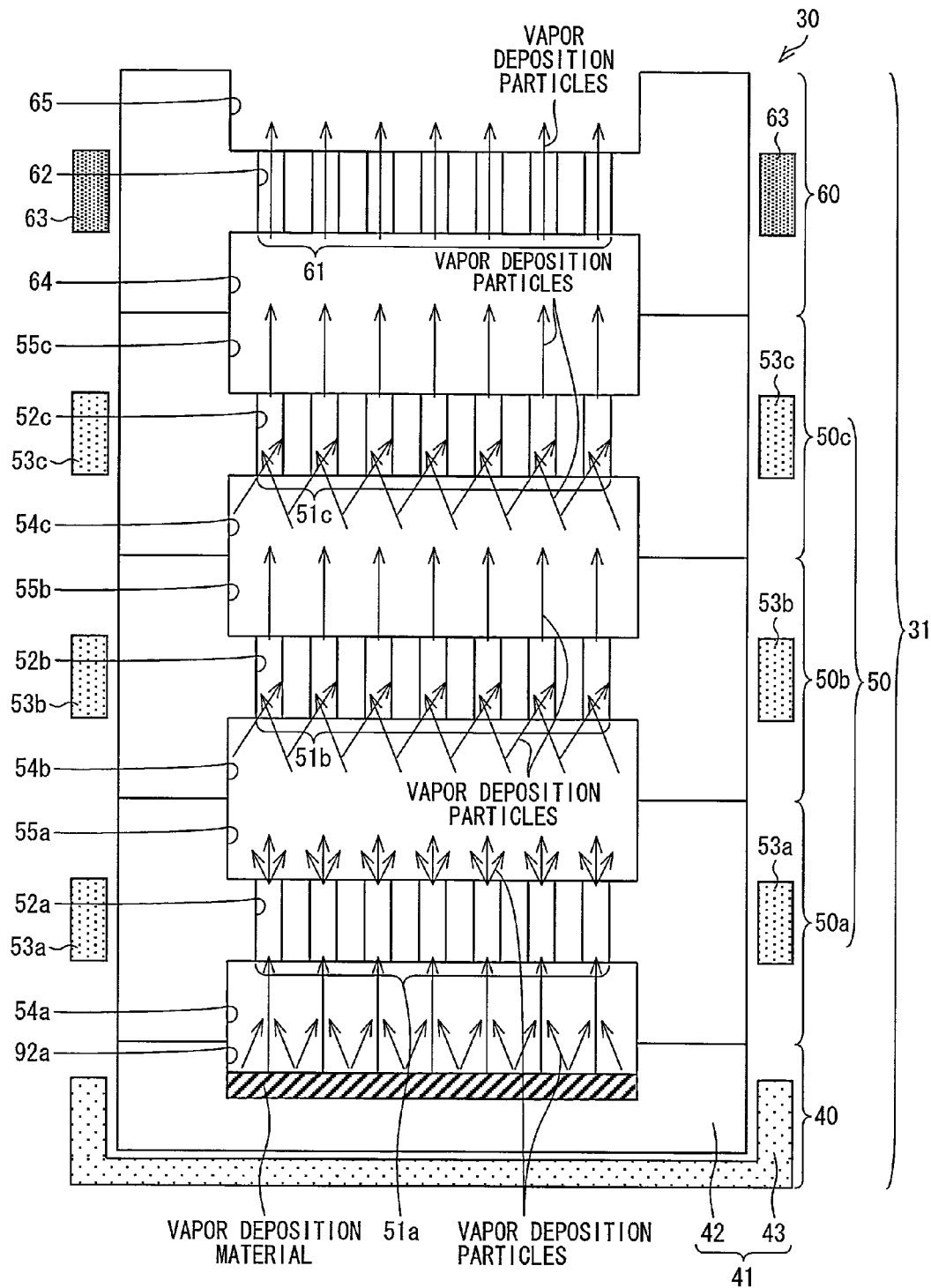

FIG. 10 is a cross sectional view schematically illustrating an outline configuration of a vapor deposition particle injection device 30 according to Embodiment 2.

The vapor deposition particle injection device 30 according to Embodiment 2 is similar in configuration to the vapor deposition particle injection device 30 of Embodiment 1, except that the vapor deposition particle injection device 30 according to Embodiment 2 includes three nozzle stages each made of an intermediate temperature control unit 50 (temperature adjusting section) similar to the intermediate temperature control unit 50 of Embodiment 1.

Therefore, only the intermediate temperature control unit 50 is described below as a configuration of the vapor deposition particle injection device 30 according to Embodiment 2.

<Configuration and Effect of Intermediate Temperature Control Unit 50>

According to Embodiment 2, as the intermediate temperature control unit 50, an intermediate temperature control unit 50a (first intermediate temperature control unit), an intermediate temperature control unit 50b (second intermediate temperature control unit), and an intermediate temperature control unit 50c (third intermediate temperature control unit) are provided in this order from the bottom, i.e., from the heating temperature control unit 40 side (see FIG. 10).

These intermediate temperature control units 50a, 50b, and 50c are each similar in configuration to the intermediate temperature control unit 50 of Embodiment 1. Note that the intermediate temperature control units 50a, 50b, and 50c may be generically referred to as the intermediate temperature control unit 50.

The intermediate temperature control units 50a, 50b, and 50c are configured to include therein respective intermediate nozzle sections 51a, 51b, and 51c as nozzle sections which are provided so as to extend across the respective intermediate temperature control units 50a, 50b, and 50c in the intermediate temperature control units 50a, 50b, and 50c, more specifically, which are provided in a device body 31 so as to project in a direction perpendicular to a nozzle surface (aperture surface) of each of the nozzle sections.

Note that in Embodiment 2, as illustrated in FIG. 10, the intermediate nozzle sections 51a, 51b, and 51c are respectively provided in center sections of the intermediate temperature control units 50a, 50b, and 50c. Further, openings 54a, 54b, and 54c in the form of a depressed shape are respectively provided at bottoms of the intermediate temperature control units 50a, 50b, and 50c, that is, below the intermediate nozzle sections 51a, 51b, and 51c. Meanwhile, openings 55a, 55b, and 55c in the form of a depressed shape are respectively provided at tops of the intermediate temperature control units 50a, 50b, and 50c, that is, above the intermediate nozzle sections 51a, 51b, and 51c.

Note that an edge section of the opening 54a which is provided at the bottom of the intermediate temperature control unit 50a that is provided so as to be adjacent to the heating temperature control unit 40 is arranged so as to form one surface at the time when the intermediate temperature control unit 50a is stacked on the heating temperature control unit 40.

Similarly, edge sections of the respective adjacent openings 55a and 54b of the adjacent intermediate temperature control units 50a and 50b are arranged so as to form one surface and edge sections of the respective adjacent openings 55b and 54c of the adjacent intermediate temperature control units 50b and 50c are arranged so as to form one surface, at the time when the intermediate temperature control units 50a, 50b, and 50c are stacked.

Further, edge sections of the opening 55c of the intermediate temperature control unit 50c and an opening 64 of a cooling temperature control unit 60, respectively, which edge sections are adjacent to each other, are arranged so as to form one surface at the time when the cooling temperature control unit 60 is stacked on the intermediate temperature control unit 50c.

Note that according to Embodiment 2, the intermediate temperature control units 50a, 50b, and 50c are each set to have a different temperature.

Therefore, an inner space formed by the openings each of which is provided in the form of a depressed shape in each of the temperature control units including the intermediate temperature control units 50a, 50b, and 50c preferably has a distance of 10 mm or more in a direction perpendicular to a film formation target surface 201 of a film formation target substrate 200. In particular, a distance between the nozzle sections is preferably arranged to be 10 mm or more.

However, in a case where any two adjacent intermediate temperature control units out of the intermediate temperature control units 50a, 50b, and 50c are each set at an identical temperature, a distance between the nozzle sections of the respective two adjacent intermediate temperature control units which are each set at an identical temperature is not limited to the above distance. Note that, also in a case where the intermediate temperature control units are each set at an identical temperature, it is possible to obtain a collimation effect yielded by a nozzle length.

Note that separation distances between every two adjacent nozzle sections in a direction perpendicular to the film formation target surface 201 of the film formation target substrate 200 may be different from each other. However, preferably, the nozzles sections are provided at regular intervals in the direction perpendicular to the film formation target surface 201.

The intermediate nozzle sections 51a, 51b, and 51c each are provided with a plurality of apertures 52a, 52b, or 52c (through holes) penetrating each of the intermediate nozzle sections 51a, 51b, and 51c in the up-and-down direction.

Further, the intermediate nozzle sections 51a, 51b, and 51c are provided therein with respective heat exchangers 53a, 53b, and 53c. The heat exchangers 53a, 53b, and 53c each are provided in a region surrounding a corresponding one of the apertures 52a, 52b, and 52c. These heat exchangers 53a, 53b, and 53c adjust and control temperatures of the respective intermediate nozzle sections 51a, 51b, and 51c.

In Embodiment 2, between a temperature of a vapor deposition particle generating section 41 and a temperature of a vapor deposition particle emitting nozzle section 61, an intermediate nozzle section closer to the vapor deposition particle emitting nozzle section 61 is set to a lower temperature. Namely, in Embodiment 2, the temperature relation is arranged as follows: the temperature of the vapor deposition particle generating section 41>the temperature of the intermediate nozzle section 51a (first intermediate nozzle section) of the bottom nozzle stage>the temperature of the intermediate nozzle section 51b (second intermediate nozzle section) of the intermediate nozzle stage>the temperature of the intermediate nozzle section 51c (third intermediate nozzle section) of the top nozzle stage>the temperature of the vapor deposition particle emitting nozzle section 61.

As described above, according to Embodiment 2, the number of nozzle stages each made of the intermediate nozzle section 510 is increased. This makes it possible to finely control reduction in the temperature of vapor deposition particles. This allows a further improvement in collimation characteristic of a vapor deposition flow in the vapor deposition particle emitting nozzle section 61. Further, according to Embodiment 2, since the reduction in the temperature of the vapor deposition particles can be finely controlled by increasing the number of nozzle stages each made of the intermediate nozzle section 510 (described earlier), it is possible to gradually reduce a temperature of a vapor deposition flow, and to further reduce a pressure around the apertures in each of the nozzle sections.

Therefore, it is possible to prevent the vapor deposition particles from being scattered at the apertures in each of the nozzle sections. This allows a further improvement in collimation characteristic of a vapor deposition flow.

Note that also in Embodiment 2, center positions of corresponding apertures in the nozzle sections, i.e., respective center positions of corresponding apertures of the apertures 52a, 52b, and 52c in the intermediate nozzle sections 51a, 51b, and 51c and a center position of a corresponding aperture 62 in the vapor deposition particle emitting nozzle section 61 are identical to one another in plan view, i.e., when viewed from a normal direction with respect to the film formation target surface 201 of the film formation target substrate 200.

As described above, in a case where the center positions of the corresponding apertures in the nozzle sections are arranged to be identical to one another when viewed from the normal direction with respect to the film formation target surface 201, it is possible to make an apparent length of the apertures in the nozzle sections be longer in proportion to the number of nozzle stages.

Therefore, according to the above configuration, an apparent aperture length becomes longer. This allows a further improvement in collimation characteristic of a vapor deposition flow.

Note that regardless of an actual aperture length (nozzle length) of each of the apertures, the apparent aperture length of the nozzle sections can be made longer by increasing the number of nozzle stages each made of the intermediate nozzle section 510.

Separation distances between every two adjacent nozzle sections in the direction perpendicular to the film formation target surface 201 of the film formation target substrate 200 may be different from each other. However, preferably, the nozzles sections are provided at regular intervals in the direction perpendicular to the film formation target surface 201.

Further, also in Embodiment 2, a length of an aperture in each of the nozzle sections (a nozzle length) is not specifically limited. However, in order to reduce a temperature of vapor deposition particles, each of the apertures 52a, 52b, and 52c in the intermediate nozzle sections 51a, 51b, and 51c preferably has a length equal to or longer than 20 mm. Further, in order to block an oblique-flow component of the vapor deposition particles, the apertures 62 in the vapor deposition particle emitting nozzle section 61 each preferably have a length equal to or longer than 20 mm.

<Experimental Comparison of Formed Film Patterns>

Figure 11:
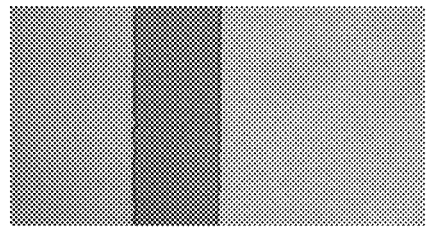

Next, for comparison, FIG. 11 shows a result obtained by actually forming a film pattern as in the case of Embodiment 1 by using, as a vapor deposition source, the vapor deposition particle injection device 30 illustrated in FIG. 10.

FIG. 11 is a diagram showing an optical micrograph of a formed film pattern obtained by using the vapor deposition particle injection device 30 illustrated in FIG. 10.

Note that for an experiment, the vapor deposition particle injection device 30 illustrated in FIG. 10 (described earlier) was used as a vapor deposition source and that a comparison was made under a condition identical to the condition used in <Experimental Comparison of Formed Film Patterns> of Embodiment 1, except that the temperature of the intermediate nozzle section 51a was set at 330° C., the temperature of the intermediate nozzle section 51b was set at 320° C., and the temperature of the intermediate nozzle section 51c was set at 310° C.

On this account, the temperature of the vapor deposition particle generating section 41 was set at 340° C., and the temperature of the vapor deposition particle emitting nozzle section 61 was set at 250° C.

Further, an aperture length (nozzle length) of each of the nozzle sections including the intermediate nozzle sections 51a, 51b, and 51c was set to 20 nm, and a space between every two adjacent nozzle sections in the direction perpendicular to the film formation target surface 201 of the film formation target substrate 200 was set to 10 mm.

As illustrated in FIG. 11, Embodiment 2 makes it possible to obtain a formed film pattern in which a pattern blur is further suppressed than in the case of Embodiment 1 and almost no pattern blur occurs. This reveals that Embodiment 2 makes it possible to form a higher-definition display panel.

<Aperture Area of Nozzle Section>

Figure 12:
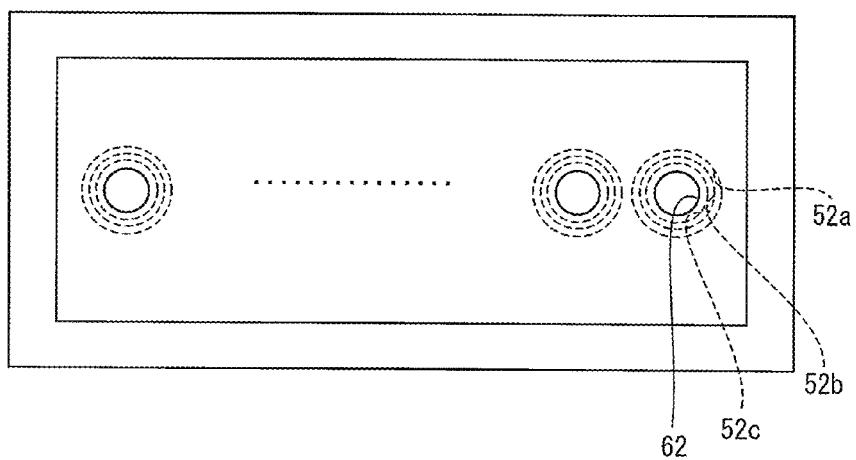

FIG. 12 is a plan view schematically illustrating one example of an outline configuration of a substantial part of the vapor deposition particle injection device 30 according to Embodiment 2. Note that in FIG. 12, the apertures 52a, 52b, and 52c in the intermediate nozzle sections 51a, 51b, and 51c are indicated by dotted lines and not all the apertures 62 in the vapor deposition particle emitting nozzle section 61 and the apertures 52 in the intermediate nozzle section 51 are illustrated.

According to the vapor deposition particle injection device 30 illustrated in FIG. 10, the apertures in each of the nozzle sections are identical in shape.

That is, Embodiment 2 has discussed, as an example, a case where the apertures 52a, 52b, and 52c in the intermediate nozzle sections 51a, 51b, and 51c and the apertures 62 in the vapor deposition particle emitting nozzle section 61 are identical in diameter, and the apertures 52a, 52b, and 52c, and the apertures 62 are configured to overlap with each other so as to be identical in position when viewed from the normal direction with respect to the film formation target surface 201 (see FIG. 10).

However, Embodiment 2 is not limited to such an example. An aperture in an upper-stage nozzle section that is provided in a higher position may be configured to have a smaller aperture area (aperture size). Namely, as illustrated in FIG. 12, the apertures 52a, 52b, and 52c, and the apertures 62 may be configured to be smaller in size in this order.

Generally, the vapor deposition particle emitting nozzle section 61 is preferably smaller in aperture size. However, in a case where the aperture size is reduced at once, clogging occurs. On this account, the aperture size is arranged to decrease stepwise for each nozzle stage or for each set of a plurality of nozzle stages. Then, a problem of such clogging does not occur. This improves production efficiency.

Embodiment 3

Embodiment 3 is described below mainly with reference to FIGS. 13 through 15.

Embodiment 3 mainly deals with how Embodiment 3 is different from Embodiments 1 and 2 above. Constituent elements of Embodiment 3 that are identical in function to their respective equivalents described in Embodiments 1 and 2 are each assigned the same reference numeral, and are not described here.

<Configuration of Vapor Deposition Particle Injection Device 30>

Figure 13:
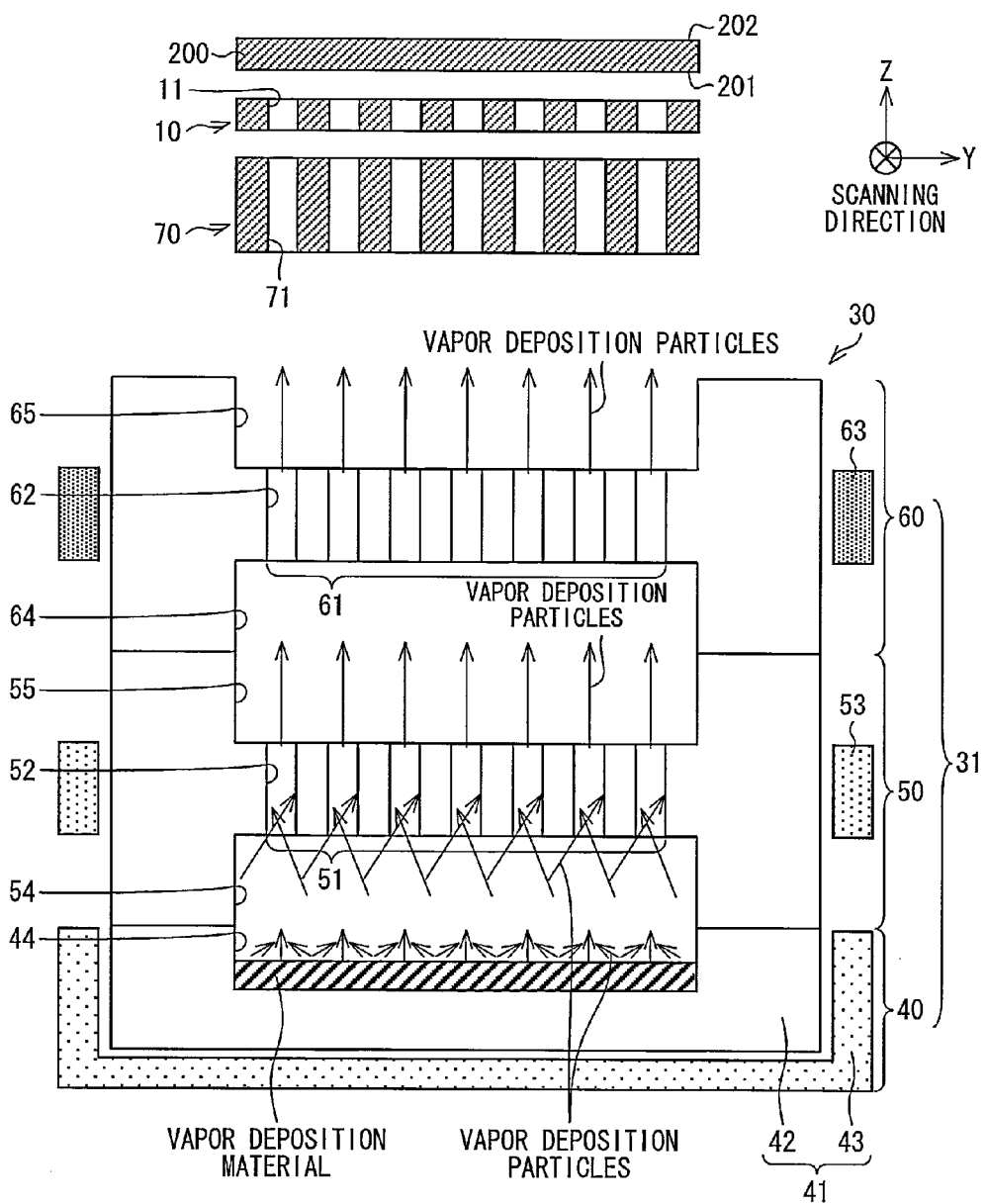

FIG. 13 is a cross sectional view schematically illustrating main components in a vacuum chamber 2 of a vapor deposition apparatus 1 according to Embodiment 3. FIG. 14 is a cross sectional view schematically illustrating an outline configuration of a substantial part of the vapor deposition apparatus 1 according to Embodiment 3.

The vapor deposition apparatus 1 according to Embodiment 3 is similar in configuration to the vapor deposition apparatus 1 of Embodiment 1, except that the vapor deposition apparatus 1 according to Embodiment 3 includes a limiting board 70 (apertures) which is provided between a mask 10 and a vapor deposition particle injection device 30.

Therefore, only the limiting board 70 will be described below as a configuration of the vapor deposition apparatus 1 according to Embodiment 3.

<Configuration and Effect of Limiting Board 70>

Embodiment 3 uses, as a vapor deposition source, the vapor deposition particle injection device 30 similar to that of Embodiment 1. However, in a case where a collimation characteristic of a vapor deposition flow needs to be further improved, it is desirable that the limiting board 70 which limits passing of vapor deposition particles be provided between the mask 10 and the vapor deposition particle injection device 30 so as to be in parallel with the mask 10.

The limiting board 70 is provided with a plurality of apertures 71 (through holes) penetrating the limiting board 70 in an up-and-down direction.

In a case where the limiting board 70 which limits passing of vapor deposition particles is thus provided between the mask 10 and the vapor deposition particle injection device 30, it is possible to improve a film thickness distribution in a film pattern formed on a film formation target substrate 200.

Figure 14:
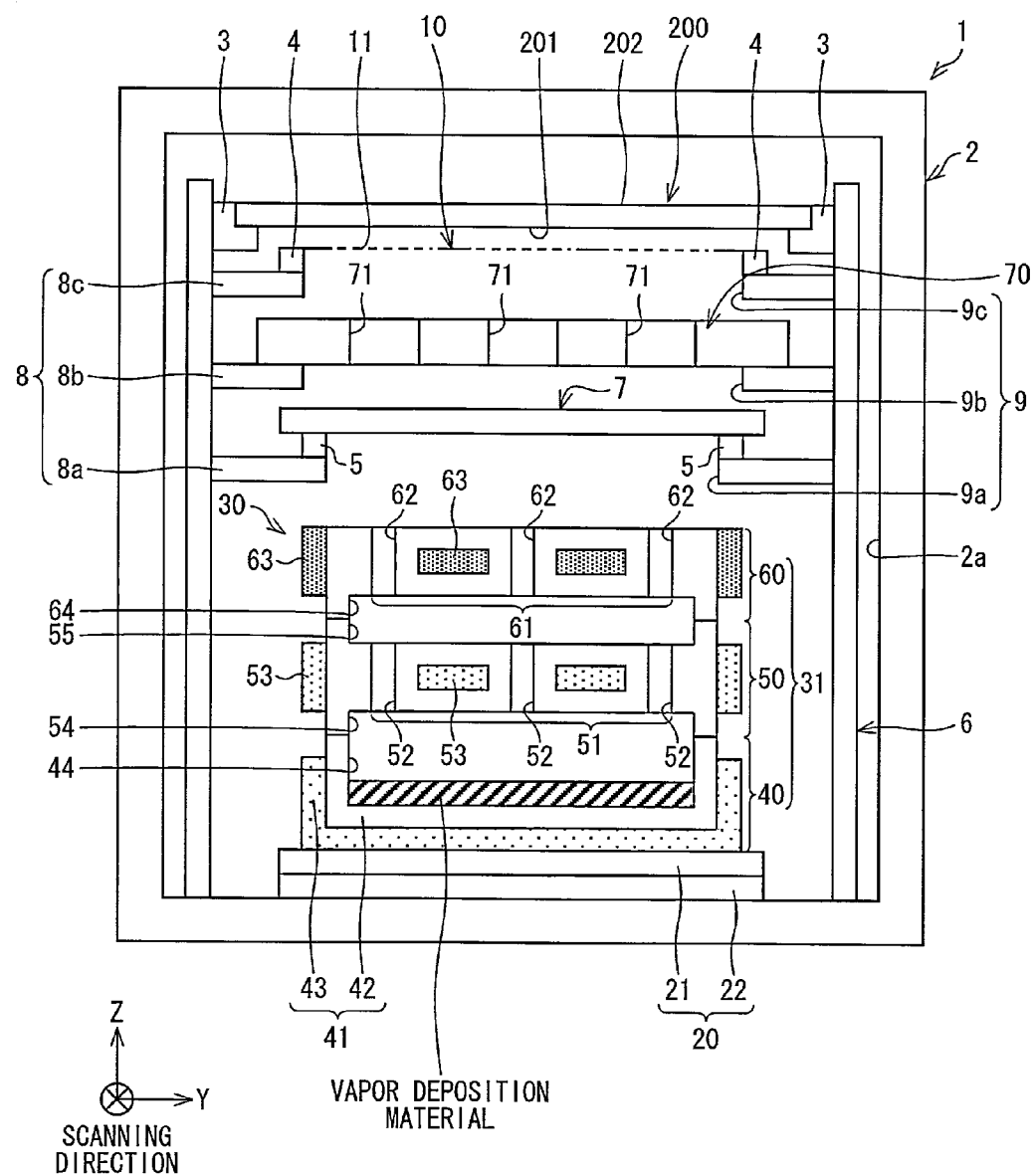

Note that, as illustrated in FIGS. 13 and 14, a center position of each of the apertures 71 in the limiting board 70 is identical to a center position of corresponding apertures 52 and 62 in nozzle sections (i.e., an intermediate nozzle section 51 and a vapor deposition particle emitting nozzle section 61) in the vapor deposition particle injection device 30, in a normal direction with respect to a film formation target surface 201 of the film formation target substrate 200.

However, an aperture shape of each of the nozzle sections of the vapor deposition particle injection device 30 (e.g., a shape and a size of each of the apertures 62) and an aperture shape of the limiting board 70 (e.g., a shape and a size of each of the apertures 71) may be different from each other.

In a case where the center positions of the apertures 52, 62, and 71 are provided in an identical position as described above, the limiting board 70 can prevent spread of a vapor deposition flow with a high accuracy even if the vapor deposition flow from the vapor deposition particle emitting nozzle section 61 slightly spreads. Therefore, as illustrated in FIGS. 13 and 14, the limiting board 70 can prevent the spread of the vapor deposition flow even if only one nozzle stage made of the intermediate nozzle section 51 is provided. This makes it possible to improve a collimation characteristic of the vapor deposition flow.

Figure 16:
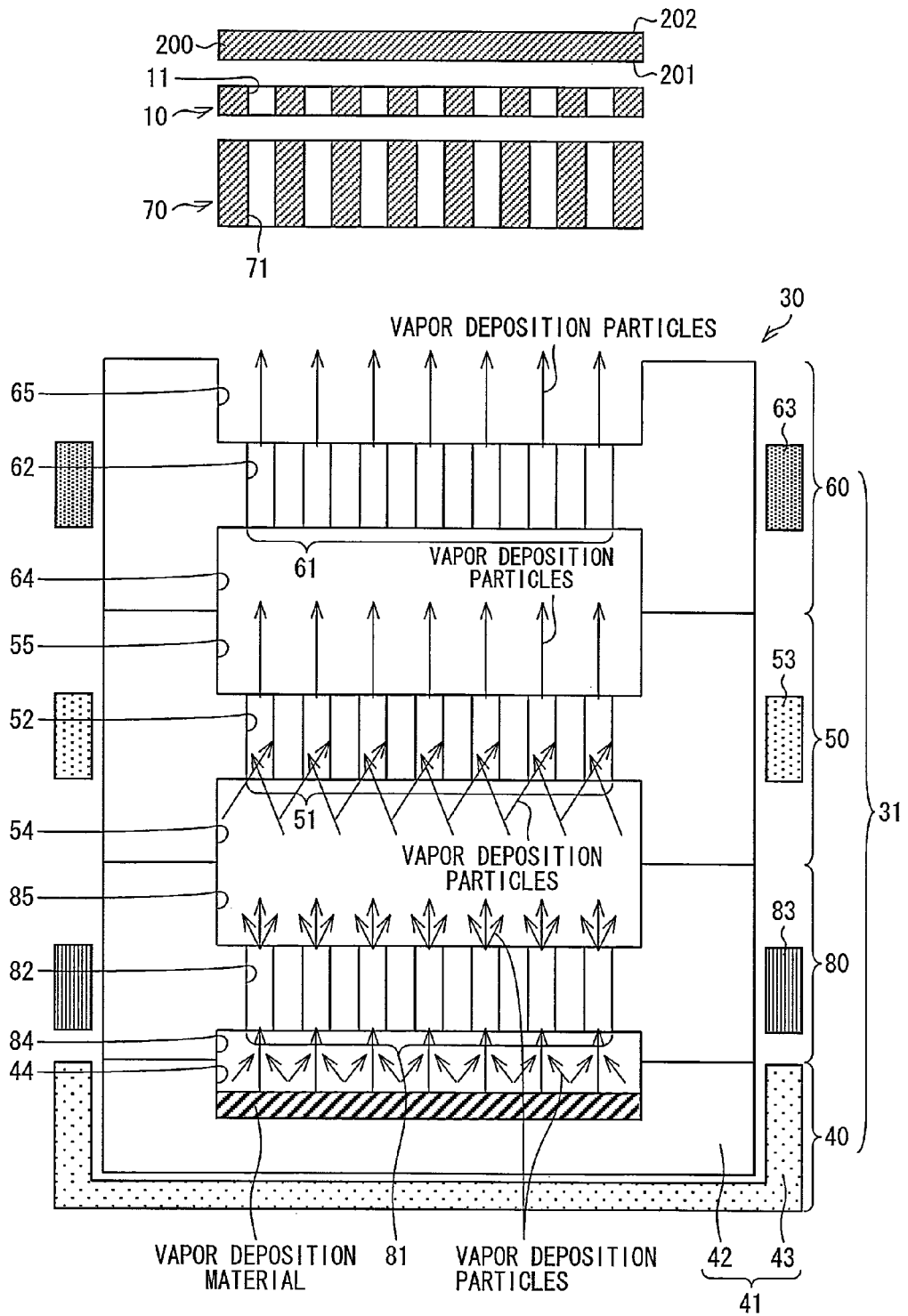

Note that for simplification, apertures 11 in the mask 10 and the apertures in the limiting board 70 are identical in shape in FIG. 16. However, actually, a pattern formed by the apertures 11 in the mask 10 is finer than that formed by the apertures of the limiting board 70.

For example, though depending on a size of the film formation target substrate 200 and/or a film pattern to be formed, it is preferable to set an aperture size of each of the apertures 71 in the limiting board 70 in a direction parallel to a scanning direction (substrate carrying direction) to be equal to or smaller than 0.2 m.

However, the aperture size which is greater than 0.2 m merely causes more vapor deposition particles to be adhered on the mask 10. This merely results in an increase in vapor deposition particle component which does not contribute to film formation.

In contrast, in a case where each of the apertures 11 in the mask 10 in the direction parallel to the scanning direction (substrate carrying direction) is too large in aperture size, a pattern accuracy deteriorates.

Therefore, in order to secure the pattern accuracy, the aperture size of the mask 10 needs to be equal to or smaller than 20 cm at the current technical level.

Though depending on a size of the film formation target substrate 200 and/or a film pattern to be formed, it is preferable to set the aperture size of the limiting board 70 in a direction perpendicular to a scanning direction (substrate carrying direction) to be equal to or smaller than 5 cm. The aperture size which is larger than 5 cm causes problems such that (i) great unevenness in thickness of a vapor-deposited film occurs on the film formation target surface 201 of the film formation target substrate 200 and (ii) an amount of difference between a pattern of the mask 10 and a formed pattern becomes too large.

A position of the limiting board 70 in a direction perpendicular to the film formation target surface 201 of the film formation target substrate 200 is not specifically limited provided that the limiting board 70 is provided between the mask 10 and the vapor deposition particle injection device 30 so as to be apart from the vapor deposition particle injection device 30. For example, the limiting board 70 may be provided so as to be in contact with the mask 10.

Note that the limiting board 70 is provided so as to be apart from the vapor deposition particle injection device 30 for the following reasons.

In order to block vapor deposition particles containing an oblique-flow component, the limiting board 70 is not heated, or is cooled by a heat exchanger (not illustrated). Therefore, the limiting board 70 has a temperature lower than a temperature of the apertures 62 serving as injection holes of the vapor deposition particle injection device 30.

Further, in order to prevent vapor deposition particles from travelling in a direction toward the film formation target substrate 200, it is necessary to provide a shutter (not illustrated) between the limiting board 70 and the vapor deposition particle injection device 30. Therefore, a distance equal to or longer than 2 cm needs to be provided between the limiting board 70 and the vapor deposition particle injection device 30.

<Experimental Comparison of Formed Film Patterns>

Figure 15:
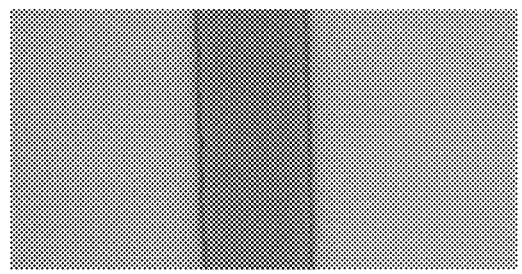

Next, for comparison, FIG. 15 shows a result obtained by actually forming a film pattern by using the vapor deposition apparatus 1 having the configurations illustrated in FIGS. 13 and 14.

FIG. 15 is a diagram illustrating an optical micrograph of a formed film pattern obtained by using the vapor deposition apparatus 1 according to Embodiment 3.

Note that, a condition used in an experiment here was identical to the condition used in <Experimental Comparison of Formed Film Patterns> of Embodiment 1, except that the limiting board 70 was provided between the mask 10 and the vapor deposition particle injection device 30 (described earlier) as a vapor deposition source and that a distance between the limiting board 70 and the vapor deposition particle injection device 30 and a distance between the limiting board 70 and the mask 10 were each set to 5 cm in the direction perpendicular to the film formation target surface 201 of the film formation target substrate 200.

On this account, a temperature of a vapor deposition particle generating section 41 was set at 340° C., a temperature of the intermediate nozzle section 51 was set to 320° C., and a temperature of the vapor deposition particle emitting nozzle section 61 was set at 250° C.

As illustrated in FIG. 15, Embodiment 3 makes it possible to obtain a formed film pattern in which a pattern blur is further suppressed than in the case of Embodiment 1 and almost no pattern blur occurs.

This reveals that Embodiment 3 makes it possible to form a higher-definition display panel. Further, a result of the above experiment reveals that according to Embodiment 3, provision of the limiting board 70 between the mask 10 and the vapor deposition particle injection device 30 makes it possible to further prevent spread of a vapor deposition flow and to further improve a collimation characteristic of the vapor deposition flow.

Embodiment 4

Embodiment 4 is described below mainly with reference to FIG. 16.

Embodiment 4 mainly deals with how Embodiment 4 is different from Embodiments 1 through 3 above. Constituent elements of Embodiment 4 that are identical in function to their respective equivalents described in Embodiments 1 through 3 are each assigned the same reference numeral, and are not described here.

<Configuration of Vapor Deposition Particle Injection Device 30>

FIG. 16 is a cross sectional view schematically illustrating main components in a vacuum chamber 2 of a vapor deposition apparatus 1 according to Embodiment 4.

A vapor deposition particle injection device 30 according to Embodiment 4 is similar in configuration to a vapor deposition particle injection device 30 of Embodiment 1, except that the vapor deposition particle injection device 30 according to Embodiment 4 further includes a heating temperature control unit 80 which includes a nozzle section that serves as a temperature adjusting section and which is provided between an intermediate temperature control unit 50 serving as a temperature adjusting section and a heating temperature control unit 40 serving as a vapor deposition material supply section.

Therefore, only the heating temperature control unit 80 will be described below as a configuration of the vapor deposition particle injection device 30 according to Embodiment 4.

<Configuration and Effect of Heating Temperature Control Unit 80>

The heating temperature control unit 80 is a heated nozzle section formation unit which is configured to include therein a heated nozzle section 81 as the nozzle section which is provided so as to extend across the heating temperature control unit 8 in the heating temperature control unit 80, more specifically, which is provided in a device body 31 so as to project in a direction perpendicular to a nozzle surface (aperture surface) of each of the nozzle sections.

The vapor deposition particle injection device 30 according to Embodiment 4 further includes the heated nozzle section 81 which serves as a nozzle section and is provided between an intermediate nozzle section 51 and a vapor deposition particle generating section 41 (see FIG. 16).

Note that in Embodiment 4, as illustrated in FIG. 16, the heated nozzle section 81 is provided, for example, at a center section of the heating temperature control unit 80. Further, openings 84 and 85 in the form of a depressed shape are respectively provided at a bottom and a top of the heating temperature control unit 80, that is, below and above the heated nozzle section 81.

An edge section of the opening 84 provided at the bottom of the heating temperature control unit 80 is arranged so that one surface is formed by the edge section of the opening 84 and an edge section of an opening 44 at the top of a heating container 42 at the time when the heating temperature control unit 80 is stacked on the heating temperature control unit 40.

The heated nozzle section 81 is provided with a plurality of apertures 82 (through holes) penetrating the heated nozzle section 81 in an up-and-down direction.

Note that also in Embodiment 4, center positions of corresponding apertures in the nozzle sections, i.e., a center position of each of the apertures 82 in the heated nozzle section 81, a center position of a corresponding one of apertures 52 in a vapor deposition particle emitting nozzle section 51 and a center position of a corresponding one of apertures 62 in a vapor deposition particle emitting nozzle section 61 are identical to one another in plan view, i.e., when viewed from a normal direction with respect to a film formation target surface 201 of a film formation target substrate 200.

Moreover, as illustrated in FIG. 16, for example, the heated nozzle section 81 is provided therein with a heat exchanger 83 that is provided in a region surrounding each of the apertures 82. This heat exchanger 83 adjusts and controls a temperature of the heated nozzle section 81.

Note that the heat exchanger 83 is not specifically limited as long as the heat exchanger 83 is capable of adjusting and controlling a temperature to a desired temperature. The heat exchanger 83 may be a well-known heat exchanger.

Vapor deposition particles emitted from the opening 44 at the top of the heating container 42 first passes through an inner space of the device body 31 which inner space is formed by the opening 44 at the top of the heating container 42 and the opening 84 at the bottom of the heating temperature control unit 80, and then are supplied to the apertures 82 provided to the heated nozzle section 81.

According to the heating temperature control unit 80 illustrated in FIG. 16, the opening 84 at the bottom of the heating temperature control unit 80 is set to have a smaller opening length (depression depth) than the opening 85 at the top of the heating temperature control unit 80, and the heated nozzle section 81 is provided near the heating container 42. The heated nozzle section 81 has the highest temperature of all the nozzle sections.

Further, the heated nozzle section 81 is controlled by the heat exchanger 83 so as to have a temperature that is higher than a temperature of the vapor deposition particle generating section 41.

In other words, according to Embodiment 4, the temperature relation is arranged as follows: the temperature of the heated nozzle section 81≥the temperature of the vapor deposition particle generating section 41≥the temperature of the intermediate nozzle section 51>the temperature of the vapor deposition particle emitting nozzle section 61.

Note that, in a case where the temperature of the heated nozzle section 81 is higher than a temperature that is 100° C. higher than the temperature at which vapor deposition particles turn into a gas phase, it is highly possible that thermal decomposition of a vapor deposition material occurs (described earlier).

The temperature of the heated nozzle section 81 is desirably controlled so that: a temperature that is 100° C. higher than the temperature at which vapor deposition particles turn into a gas phase≥the temperature of the heated nozzle section 81≥the temperature of the vapor deposition particle generating section 41.

The heated nozzle section 81 achieves collimation of a vapor deposition flow by a physical length (aperture length, nozzle length) of each of the apertures 82 in the heated nozzle section 81 in a state in which no vapor deposition particles are adhered to wall surfaces of the apertures 82 (through holes) provided to the heated nozzle section 81.

Namely, Embodiment 4 achieves collimation of a vapor deposition flow by a nozzle length before the vapor deposition flow reaches a nozzle section whose temperature is lower. According to this, Embodiment 4 can further reduce an oblique-flow component contained to be trapped from vapor deposition particles.

Modified Examples

Note that the above Embodiments have discussed, as an example, a case where the apertures 62 in the vapor deposition particle emitting nozzle section 61, the apertures 52 in the intermediate nozzle section 51, and the apertures 82 in the heated nozzle section 81 are identical in diameter.

However, an embodiment of the present invention is not limited to such an example. As described in Embodiments 1 and 2, adjacent nozzle stages each made of the nozzle section may be arranged by corresponding heat exchangers so that an aperture area of each of the plurality of apertures in one nozzle section of an upper nozzle stage is equal to or smaller than an aperture area of a corresponding aperture in the other nozzle section of a lower nozzle stage, more preferably so that an aperture area of each of the plurality of apertures in one nozzle section of the upper nozzle stage is smaller than an aperture area of a corresponding aperture in the other nozzle section of the lower nozzle stage.

Embodiment 5

Embodiment 5 is described below mainly with reference to FIG. 17.

Embodiment 5 mainly deals with how Embodiment 5 is different from Embodiments 1 through 4 above. Constituent elements of Embodiment 5 that are identical in function to their respective equivalents described in Embodiments 1 through 4 are each assigned the same reference numeral, and are not described here.

<Configuration and Effect of Vapor Deposition Particle Injection Device 30>

Figure 17:
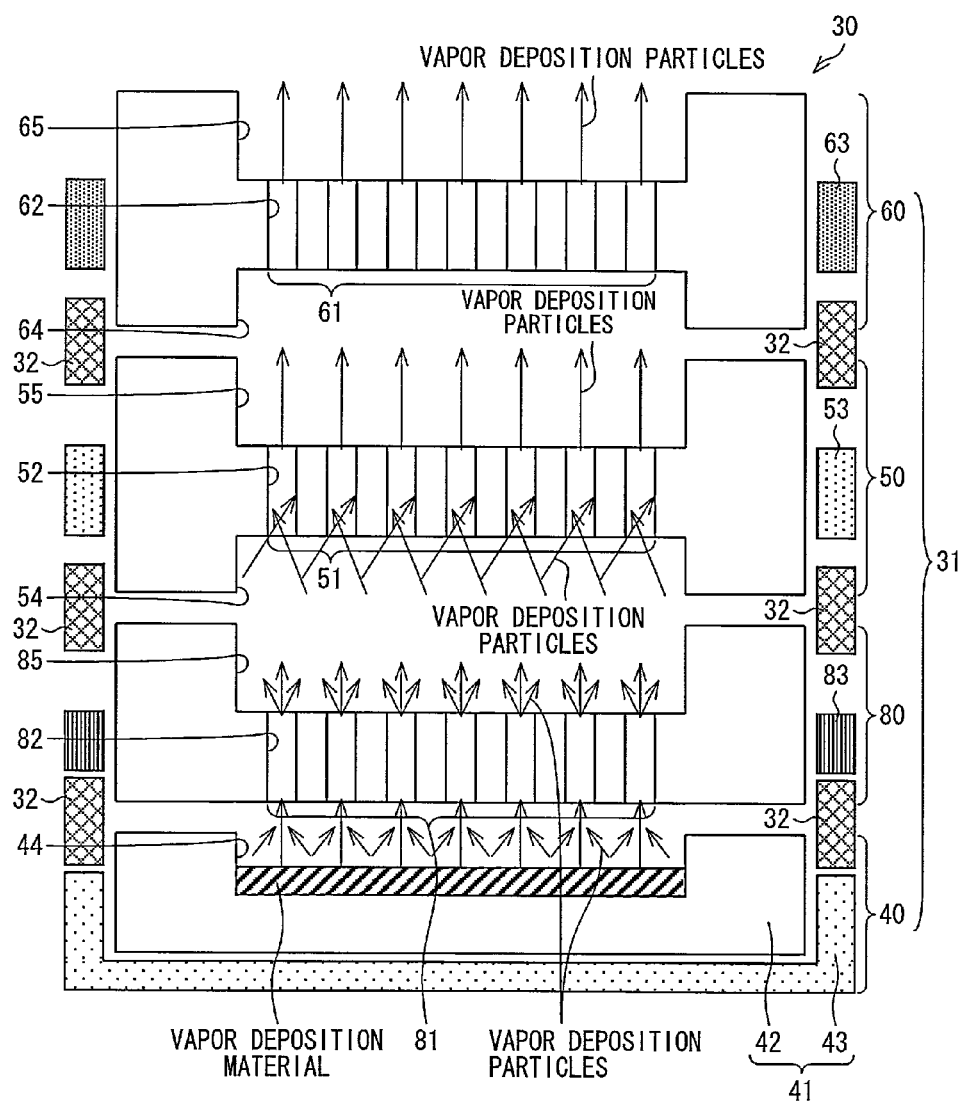

FIG. 17 is a cross sectional view schematically illustrating main components in a vacuum chamber 2 of a vapor deposition apparatus 1 according to Embodiment 5.

As illustrated in FIG. 17, a vapor deposition particle injection device 30 according to Embodiment 5 is configured to include a plurality of temperature control units which constitute a device body 31 and are separately provided with a gap between each two temperature control units so as to overlap with each other in an up-and-down direction. The vapor deposition particle injection device 30 is configured to further include a trap 32 (vapor deposition particle trapping section) for trapping vapor deposition particles, the trap 32 being provided to a section corresponding to the gap between the each two temperature control units.

Namely, according to Embodiment 5, traps 32 are respectively provided between a heating temperature control unit 40 and a heating temperature control unit 80, between the heating temperature control unit 80 and an intermediate temperature control unit 50, and between the intermediate temperature control unit 50 and a cooling temperature control unit 60.

The vapor deposition particle injection device 30 according to Embodiment 5 is basically similar in configuration to the vapor deposition particle injection device 30 of Embodiment 4 except for the point described above.

Note that in the example illustrated in FIG. 17, no opening 84 is provided below a heated nozzle section 81. However, the presence or absence of such an opening has no influence on the effects of the present invention.

In view of efficient trapping of the vapor deposition particles, the trap 32 is preferably cooled by a heat exchanger (not illustrated).

The trap 32 may be, for example, a cooling body detachably provided outside the device body 31 (i.e., outside the plurality of temperature control units) so as to close the gap between the each two temperature control units, and such a trap 32 may trap the vapor deposition particles by adsorbing the vapor deposition particles onto the cooling body.

Alternatively, the trap 32 may include a container for containing the vapor deposition particles that come in through a gap between each two temperature control units, the container being provided outside the device body 31 so as to close the gap between the each two temperature control units. The trap 32 may be configured to trap the vapor deposition particles in the container by leaving the container to cool down or by cooling the container with use of a heat exchanger (not illustrated). Namely, the cooling body may be provided so as to be in contact with a gap or gaps each existing between two temperature control units, or may have a container provided to cover a gap or gaps each existing between two temperature control units.

A method for the cooling is not specifically limited. For example, water cooling may be used for the cooling.

As described earlier, according to Embodiment 5, in a case where a gap exists between two temperature control units, the trap 32 for trapping the vapor deposition particles is provided to a section corresponding to the gap. This makes it possible to suppress or prevent the vapor deposition particles from being scattered in the device body 31.

<Summary Outline>

As described above, a vapor deposition particle injection device of each of the above embodiments includes: (1) a vapor deposition particle generating section generating vapor deposition particles in a gas phase, by heating a vapor deposition material; (2) a vapor deposition particle emitting nozzle section provided with a plurality of through holes for emitting the vapor deposition particles generated in the vapor deposition particle generating section, to outside the vapor deposition particle generating section; and (3) at least one intermediate nozzle section (at least one nozzle stage made of an intermediate nozzle section) including a plurality of through holes, and being provided between the vapor deposition particle generating section and the vapor deposition particle emitting nozzle section so as to be apart from the vapor deposition particle generating section and the vapor deposition particle emitting nozzle section and so as to overlap the vapor deposition particle generating section and the vapor deposition particle emitting nozzle section, the vapor deposition particle generating section of (1), the vapor deposition particle emitting nozzle section of (2), and the intermediate nozzle section of (3) including temperature adjustment members, respectively, the vapor deposition particle emitting nozzle section of (1) being controlled by a corresponding temperature adjustment member so as to be at a temperature that is lower than a temperature at which the vapor deposition material turns into gas, the intermediate nozzle section (3) being controlled by a corresponding temperature adjustment member so as to be at a temperature between a temperature of the vapor deposition particle generating section and the temperature of the vapor deposition particle emitting nozzle section.

In the above configuration, the through holes in the vapor deposition particle emitting nozzle section is set at a temperature that is lower than a temperature at which the vapor deposition material turns into gas, as described above. This makes it possible to block an oblique-flow component of a vapor deposition flow. Therefore, collimation of the vapor deposition flow becomes possible.

Further, in the above configuration, the intermediate nozzle section is provided. Accordingly, because a stepwise decrease in temperature of the above nozzle sections from the vapor deposition particle generating section to the vapor deposition particle emitting nozzle section can be achieved, it becomes possible to linearize a flow of the vapor deposition particles and thereby to reduce the vapor deposition material that adheres to respective wall surfaces of the nozzle sections.

Further, by reducing the temperature of the vapor deposition particles at the intermediate nozzle section, a pressure can be reduced locally at the through holes in the vapor deposition particle emitting nozzle section. This makes it possible to prevent the vapor deposition particles from being scattered at the through holes in the vapor deposition particle emitting nozzle section.

Furthermore, because the pressure in and in the vicinity of the vapor deposition particle emitting nozzle section is reduced as described above, it is possible to prevent a phenomenon in which a mean free path of the vapor deposition particles becomes shorter at the vapor deposition particle emitting nozzle section. This allows a further improvement in collimation characteristic of a vapor deposition flow.

Accordingly, the above configuration can make (i) directions in which the vapor deposition particles travel from a position at which the vapor deposition particles have been injected from the vapor deposition particle injection device to a position at which the vapor deposition particles reach the vapor deposition mask be parallel to (ii) a normal direction with respect to the film formation target surface of the film formation target substrate, in a case where a desired film pattern is to be formed by vapor-depositing, onto the film formation target substrate, the vapor deposition particles injected from the vapor deposition particle injection device through the through holes provided in a vapor deposition mask that is provided so as to face the vapor deposition particle injection device.

Accordingly, when the vapor deposition particle injection device is applied to a vapor deposition apparatus and a vapor deposition method each for carrying out vapor deposition with use of a vapor deposition mask, the vapor deposition particles that travel in a direction perpendicular to the mask surface of the vapor deposition mask pass through the through holes in the vapor deposition mask and then adhere to the film formation target substrate in conformity with a mask pattern. This makes it possible to eliminate blurring of a formed film pattern and therefore to form a film pattern with a high accuracy.

Further, in the above configuration, the vapor deposition flow is collimated at the intermediate nozzle section that is a preceding nozzle stage to the vapor deposition particle emitting nozzle section, before the vapor deposition particles arrive at the vapor deposition particle emitting nozzle section. This makes it possible to suppress/prevent adhesion of the vapor deposition particles onto the wall surfaces of the through holes in the vapor deposition particle emitting nozzle section.

In the vapor deposition particle injection device, preferably, the intermediate nozzle section is controlled so as to be at a temperature that is higher than a temperature at which the vapor deposition material turns into gas.

In a case where the temperature of the intermediate nozzle section is lower than a temperature at which the vapor deposition particles turn into a gas phase, the vapor deposition particles adhere to the intermediate nozzle section.

On this account, it is desirable that the temperature of the intermediate nozzle section be controlled so as to be a temperature that is higher than a temperature at which the vapor deposition particles turn into gas.

Further, in the vapor deposition particle injection device, preferably, a center position of each of the plurality of through holes in the intermediate nozzle section is identical to a center position of a corresponding through hole in the vapor deposition particle emitting nozzle section, when viewed from a direction in which the vapor deposition particle emitting nozzle section and the intermediate nozzle section overlap each other.

In this way, the through holes in the particle emitting nozzle section and the through holes in the intermediate nozzle section are formed so that a position of each of the through holes in the vapor deposition particle emitting nozzle section and a positions of a corresponding through hole in the intermediate nozzle section overlap each other. This allows an increase in apparent length (nozzle length) of the thorough holes in a direction in which the through holes are opening and further allows a collimation characteristic of a vapor deposition flow to be further improved due to an effect of the nozzle length.

Further, preferably, the at least one intermediate nozzle section is plurally provided in a direction in which the vapor deposition particle emitting nozzle section and the intermediate nozzle section overlap each other and thus plurally provided intermediate nozzle sections are respectively provided with temperature adjustment members; and any two adjacent intermediate nozzle sections are controlled by respective corresponding temperature adjustment members so that a temperature of one intermediate nozzle section closer to the vapor deposition particle emitting nozzle section is equal to or lower than a temperature of the other intermediate nozzle section closer to the vapor deposition particle generating section than the one intermediate nozzle section.

Further, more preferably, the plurally provided intermediate nozzle sections are controlled by the respective corresponding temperature members so that a temperature of one intermediate nozzle section closer to the vapor deposition particle emitting nozzle section is lower than a temperature of another intermediate nozzle section that is farther from the vapor deposition particle emitting nozzle section and closer to the vapor deposition particle generating section than the one intermediate nozzle section.

The configuration as described above makes it possible to achieve a stepwise decrease in temperature of the above nozzle sections from the vapor deposition particle generating section to the vapor deposition particle emitting nozzle section by decreasing the temperature stepwise for each nozzle stage made of a nozzle section or for each set of a plurality of nozzles stages each made of a nozzle section.

This makes it possible to linearize a flow of the vapor deposition particles and thereby to reduce the vapor deposition material that adheres to respective wall surfaces of the nozzle sections. This thereby makes it possible to prevent the particle emitting nozzle section from clogging. At the same time, a pressure at the through holes in the particle emitting nozzle section can be locally reduced. This allows a further improvement in collimation characteristic of a vapor deposition flow.

Further, by providing a plurality of intermediate nozzle sections, a greater collimation effect yielded by a nozzle length can be obtained.

Further, preferably, an aperture area of each of the plurality of through holes in the intermediate nozzle section is larger than an aperture area of a corresponding through hole in the vapor deposition particle emitting nozzle section, when viewed from a direction in which the vapor deposition particle emitting nozzle section and the intermediate nozzle section overlap each other.

Furthermore, in a case where the plurality of intermediate nozzle sections are provided, preferably, an aperture area of each of the plurality of through holes in each of the plurally provided intermediate nozzle sections is larger than an aperture area of a corresponding through hole in the vapor deposition particle emitting nozzle section, when viewed from the direction in which the vapor deposition particle emitting nozzle section and the intermediate nozzle sections overlap each other; and any two adjacent intermediate nozzle sections are arranged so that an aperture area of each of the plurality of through holes in one intermediate nozzle section closer to the vapor deposition particle emitting nozzle section is equal to or smaller than an aperture area of a corresponding through hole in the other intermediate nozzle section closer to the vapor deposition particle generating section than the one intermediate nozzle section.

Further, more preferably, the plurality of through holes in the plurally provided intermediate nozzle sections are arranged so that each of a plurality of through hole in one intermediate nozzle section closer to the vapor deposition particle emitting section is smaller in aperture area than a corresponding through hole in another intermediate nozzle section that is farther from the vapor deposition particle emitting nozzle section and closer to the vapor deposition particle generating section than the one intermediate nozzle section.

In general, it is better that each of the injection holes of the vapor deposition particles that are to be injected outward from the vapor deposition particle injection device have a smaller aperture area in the vapor deposition particle injection device. Accordingly, it is better that an aperture area in the particle emitting nozzle section be smaller. However, if the aperture area is reduced at a time, clogging occurs.

In the configurations described above, an aperture area of each of the plurality of through holes in the intermediate nozzle section is larger than an aperture area of a corresponding through hole in the vapor deposition particle emitting nozzle section, when viewed from a direction in which the vapor deposition particle emitting nozzle section and the intermediate nozzle section overlap each other. This allows a stepwise reduction in aperture area of the thorough holes of the nozzle sections from the vapor deposition particle generating section to the vapor deposition particle emitting nozzle section.

Further, in a case where the plurality of intermediate nozzle sections are provided as described above, the through holes can be configured such that: (A) regarding any two adjacent intermediate nozzle sections, an aperture area of each of the plurality of through holes in one intermediate nozzle section closer to the vapor deposition particle emitting nozzle section is equal to or smaller than an aperture area of a corresponding through hole in the other intermediate nozzle section closer to the vapor deposition particle generating section than the one intermediate nozzle section or (B) each of a plurality of through holes in one intermediate nozzle section closer to the vapor deposition particle emitting nozzle section is smaller in aperture area than a corresponding through hole in another intermediate nozzle section that is farther from the vapor deposition particle emitting nozzle section and closer to the vapor deposition particle generating section than the one intermediate nozzle section. This configuration makes it possible to reduce stepwise, for each nozzle stage made of a nozzle section or for each set of a plurality of nozzles stages each made of a nozzle section, the aperture area of the through holes in the above-described nozzle sections.

Therefore, in the above configuration, the clogging as describe above does not occur. This makes it possible to improve production efficiency.

Further, preferably, the vapor deposition particle injection device further includes: a heated nozzle section including a plurality of through holes, the heated nozzle section being provided between the vapor deposition particle generating section and the intermediate nozzle section so as to be apart from the vapor deposition particle generating section and the intermediate nozzle section and so as to overlap the vapor deposition particle generating section and the intermediate nozzle section, the heated nozzle section having a temperature that is controlled to a temperature higher than a temperature of the vapor deposition particle generating section, the plurality of through holes in the heated nozzle section each having a center position that is identical to a center position of a corresponding through hole in the intermediate nozzle section, when viewed from a direction in which the heated nozzle section overlaps the vapor deposition particle generating section and the intermediate nozzle section.

In the above configuration, a vapor deposition flow can be collimated by a physical length (nozzle length) of each of the through holes in the heated nozzle section in a state where the vapor deposition particles are not adhered to the wall surfaces of the through holes in the heated nozzle section, before the vapor deposition particles reaches a nozzle section whose temperature is lower.

Further, preferably, the vapor deposition particle injection device further includes a vapor deposition particle trapping section for trapping the vapor deposition particles, the vapor deposition particle trapping section being provided to a section corresponding to a gap between different units in each of which one nozzle section out of the vapor deposition particle emitting nozzle section, the intermediate nozzle section, and the heated nozzle section is formed.

As described above, each of the above nozzle sections is provided in a different unit. Therefore, even when the vapor deposition particles adhere to the wall surfaces of the through holes of any of the nozzle sections, it is not necessary to take out the vapor deposition particle injection device itself from the vacuum chamber for cleaning the nozzle section.

Further, in the above configuration, the vapor deposition particle trapping section for trapping the vapor deposition particles is provided to a section corresponding to a gap between different units in each of which one nozzle section out of the vapor deposition particle emitting nozzle section, the intermediate nozzle section, and the heated nozzle section is provided. This makes it possible to suppress or prevent the vapor deposition particles from scattering in the vapor deposition particle injection device body.

Preferably, the vapor deposition particle trapping section is a cooling body detachably provided outside the units so as to close the gap between the units.

This makes it possible to efficiently trap the vapor deposition particles.

The vapor deposition apparatus of the present invention of each of the above embodiments, for forming a film in a predetermined pattern on a film formation target substrate, the vapor deposition apparatus includes: (1) the vapor deposition particle injection device; (2) a vapor deposition mask including through holes, the vapor deposition mask allowing the vapor deposition particles having been injected from the vapor deposition particle injection device to pass through the through holes so that the vapor deposition particles are vapor-deposited onto the film formation target substrate, the vapor deposition mask having an area that is smaller than an area of a vapor deposition target region of the film formation target substrate; and (3) moving means that moves at least one of the film formation target substrate and a set of the vapor deposition particle injection device and the vapor deposition mask relative to the other, in a state where the vapor deposition mask and the film-formed substrate are kept apart by a constant distance from each other.

The vapor deposition method of each of the embodiments includes the step of forming a film in a predetermined pattern on a film formation target substrate by use of the vapor deposition apparatus, by moving at least one of the film formation target substrate and a set of the vapor deposition particle injection device and the vapor deposition mask relative to the other, in a state where the vapor deposition mask and the film formation target substrate are kept apart by a constant distance from each other.

In each of the above described configurations, the vapor deposition apparatus includes the vapor deposition particle injection device. This can make (i) directions in which the vapor deposition particles travel from a position at which the vapor deposition particles have been injected from the vapor deposition particle injection device to a position at which the vapor deposition particles reaches the vapor deposition mask be parallel to (ii) the normal direction with respect to the film formation target surface of the film formation target substrate.

Therefore, the vapor deposition particles that travel in a direction that is perpendicular to the mask surface of the vapor deposition mask pass through the through holes in the vapor deposition mask and then adhere to the film formation target substrate in conformity with a mask pattern. This makes it possible to eliminate blurring of a formed film pattern and therefore to form a film pattern with a high accuracy, even when the vapor deposition mask with use of which a vapor-deposited film is formed is smaller in area than the vapor deposition target region of the film formation target substrate and the vapor-deposited film is formed in a state where the film formation target substrate and the vapor deposition mask are set apart from each other.

Further, preferably, the vapor deposition apparatus further includes: a limiting board provided between the vapor deposition particle injection device and the vapor deposition mask, the limiting board for limiting passage of the vapor deposition particles.

As described above, the limiting board is provided between the vapor deposition particle injection device and the vapor deposition mask. This makes it possible to prevent spread of a vapor deposition flow and to further improve a collimation characteristic of the vapor deposition flow.

Further, the film in the predetermined pattern can be made of an organic layer in an organic electroluminescent element. The above vapor deposition apparatus can be suitably used as a device for producing an organic electroluminescent element. That is, the vapor deposition apparatus may be a device for producing an organic electroluminescent element.

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

INDUSTRIAL APPLICABILITY

The vapor deposition particle injection device, vapor deposition apparatus and vapor deposition method of the present invention are suitably applicable to, for example, a device and method for producing an organic EL display device which are used in a film formation process of, for example, formation of an organic layer by selective vapor deposition in an organic EL display device.

REFERENCE SIGNS LIST 1 vapor deposition apparatus
2 vacuum chamber
2a inner wall
3 substrate moving unit (moving means)
4 mask moving unit (moving means)
5 shutter operation unit
6 holder
7 shutter
8 projecting section
8a first projecting section
8b second projecting section
8c third projecting section
9 opening
9a first opening
9b second opening
9c third opening
10 mask (vapor deposition mask)
10a long side
10b short side
11 aperture (through hole)
20 vapor deposition particle injection device shifting unit
21 stage
22 actuator
30 vapor deposition particle injection device
31 device body (vapor deposition particle injection device body)
32 trap (vapor deposition particle trapping section)
40 heating temperature control unit (unit)
41 vapor deposition particle generating section
42 heating container
43 heat exchanger (temperature adjustment member)
44 opening
50 intermediate temperature control unit (unit)
50a, 50b, 50c intermediate temperature control unit (unit)
51 intermediate nozzle section
51a, 51b, 51c intermediate nozzle section
52 aperture (through hole)
52a, 52b, 52c aperture (through hole)
53 heat exchanger (temperature adjustment member)
54 opening
54a, 54b, 54c opening
55 opening
55a, 54b, 55c opening
60 cooling temperature control unit (unit)
61 vapor deposition particle emitting nozzle section
62 aperture (through hole, injection hole)
63 heat exchanger (temperature adjustment member)
64, 65 opening
70 limiting board
71 aperture
80 heating temperature control unit (unit)
81 heated nozzle section
82 aperture
83 heat exchanger (temperature adjustment member)
84, 85 opening
100 organic EL display device
101R, 101G, 101B pixel
110 TFT substrate
111 insulating substrate
112 TFT
113 wire
114 interlayer insulating film
114a contact hole
115 edge cover
120 organic EL element
121 first electrode
122 hole injection layer/hole transfer layer
123R, 123G, 123B luminescent layer
124 electron transfer layer
125 electron injection layer
126 second electrode
130 adhesive layer
140 sealing substrate
200 film formation target substrate
200a long side
201 film formation target surface
202 non-film-formation-target surface

The invention claimed is:

1. A vapor deposition method comprising the step of forming a film in a predetermined pattern on a film formation target substrate by use of a vapor deposition apparatus,
the vapor deposition apparatus comprising:
a vapor deposition particle injection device;
a vapor deposition mask including through holes, the vapor deposition mask allowing the vapor deposition particles having been injected from the vapor deposition particle injection device to pass through the through holes so that the vapor deposition particles are vapor-deposited onto the film formation target substrate, the vapor deposition mask having an area that is smaller than an area of a vapor deposition target region of the film formation target substrate; and
moving means that moves at least one of the film formation target substrate and a set of the vapor deposition particle injection device and the vapor deposition mask relative to the other, in a state where the vapor deposition mask and the film-formed substrate are kept apart by a constant distance from each other, the vapor deposition particle injection device, comprising;

a vapor deposition particle generating section generating vapor deposition particles in a gas phase, by heating a vapor deposition material;

a vapor deposition particle emitting nozzle section provided with a plurality of through holes for emitting the vapor deposition particles generated in the vapor deposition particle generating section, to outside the vapor deposition particle generating section; and at least one intermediate nozzle section including a plurality of through holes, and being provided between the vapor deposition particle generating section and the vapor deposition particle emitting nozzle section so as to be apart from the vapor deposition particle generating section and the vapor deposition particle emitting nozzle section and so as to overlap the vapor deposition particle generating section and the vapor deposition particle emitting nozzle section;

the vapor deposition particle generating section, the vapor deposition particle emitting nozzle section, and the intermediate nozzle section including temperature adjustment members, respectively;

the vapor deposition particle emitting nozzle section being controlled by a corresponding temperature adjustment member so as to be at a temperature that is lower than a temperature at which the vapor deposition material turns into gas;

the intermediate nozzle section being controlled by a corresponding temperature adjustment member so as to be at a temperature between a temperature of the vapor deposition particle generating section and the temperature of the vapor deposition particle emitting nozzle section, wherein the sequence comprising the step of:

constructing a vapor deposition apparatus comprising a vapor deposition particle generating section, an intermediate nozzle section and a vapor deposition particle emitting nozzle section;

connecting temperature adjustment members to each corresponding section;

configuring a temperature in the vapor deposition particle emitting nozzle section by the corresponding temperature adjustment member so as to be at a temperature that is lower than a temperature at which vapor deposition material turns into gas;

configuring a temperature in the intermediate nozzle section by the corresponding temperature adjustment member so as to be at a temperature between a temperature of the vapor deposition particle generating section and the temperature of the vapor deposition particle emitting nozzle section;

generating a vapor deposition particle in the vapor deposition particle generating section by the corresponding temperature adjustment member at a temperature higher than the temperature at the intermediate nozzle section;

moving at least one of the film formation target substrate and a set of the vapor deposition particle injection device and a vapor deposition mask relative to the other by moving means, in a state where the vapor deposition mask and the film-formed substrate are kept apart by a constant distance from each other;

depositing the vapor deposition particle onto a film formation target substrate by allowing the vapor deposition particles injected from the vapor deposition particle injection device to pass through holes of the vapor deposition mask.

2. A vapor deposition method as set forth in claim 1, wherein:
the intermediate nozzle section is controlled so as to be at a temperature that is higher than a temperature at which the vapor deposition material turns into gas.

3. A vapor deposition method as set forth in claim 1, wherein:
a center position of each of the plurality of through holes in the intermediate nozzle section is identical to a center position of a corresponding through hole in the vapor deposition particle emitting nozzle section, when viewed from a direction in which the vapor deposition particle emitting nozzle section and the intermediate nozzle section overlap each other.

4. A vapor deposition method as set forth in claim 1, wherein:
the intermediate nozzle section is plurally provided in a direction in which the vapor deposition particle emitting nozzle section and the intermediate nozzle section overlap each other and thus plurally provided intermediate nozzle sections are respectively provided with temperature adjustment members; and
any two adjacent intermediate nozzle sections are controlled by respective corresponding temperature adjustment members so that a temperature of one intermediate nozzle section closer to the vapor deposition particle emitting nozzle section is equal to or lower than a temperature of the other intermediate nozzle section closer to the vapor deposition particle generating section than the one intermediate nozzle section.

5. A vapor deposition method as set forth in claim 4, wherein:
the plurally provided intermediate nozzle sections are controlled by the respective corresponding temperature members so that a temperature of one intermediate nozzle section closer to the vapor deposition particle emitting nozzle section is lower than a temperature of another intermediate nozzle section that is farther from the vapor deposition particle emitting nozzle section and closer to the vapor deposition particle generating section than the one intermediate nozzle section.

6. A vapor deposition method as set forth in claim 4, wherein:
an aperture area of each of the plurality of through holes in each of the plurally provided intermediate nozzle sections is larger than an aperture area of a corresponding through hole in the vapor deposition particle emitting nozzle section, when viewed from the direction in which the vapor deposition particle emitting nozzle section and the intermediate nozzle sections overlap each other; and
any two adjacent intermediate nozzle sections are arranged so that an aperture area of each of the plurality of through holes in one intermediate nozzle section closer to the vapor deposition particle emitting nozzle section is equal to or smaller than an aperture area of a corresponding through hole in the other intermediate nozzle section closer to the vapor deposition particle generating section than the one intermediate nozzle section.

7. A vapor deposition method as set forth in claim 6, wherein:
the plurality of through holes in the plurally provided intermediate nozzle sections are arranged so that each of a plurality of through hole in one intermediate nozzle section closer to the vapor deposition particle emitting section is smaller in aperture area than a corresponding through hole in another intermediate nozzle section that is farther from the vapor deposition particle emitting nozzle section and closer to the vapor deposition particle generating section than the one intermediate nozzle section.

8. A vapor deposition method as set forth in claim 1, wherein:

an aperture area of each of the plurality of through holes in the intermediate nozzle section is larger than an aperture area of a corresponding through hole in the vapor deposition particle emitting nozzle section, when viewed from a direction in which the vapor deposition particle emitting nozzle section and the intermediate nozzle section overlap each other.

9. A vapor deposition method as set forth in claim 1, the vapor deposition particle injection device further comprising:

a heated nozzle section including a plurality of through holes, the heated nozzle section being provided between the vapor deposition particle generating section and the intermediate nozzle section so as to be apart from the vapor deposition particle generating section and the intermediate nozzle section and so as to overlap the vapor deposition particle generating section and the intermediate nozzle section, the heated nozzle section having a temperature that is controlled to a temperature higher than a temperature of the vapor deposition particle generating section, the plurality of through holes in the heated nozzle section each having a center position that is identical to a center position of a corresponding through hole in the intermediate nozzle section, when viewed from a direction in which the heated nozzle section overlaps the vapor deposition particle generating section and the intermediate nozzle section.

10. A vapor deposition method as set forth in claim 1, further comprising:

a vapor deposition particle trapping section for trapping the vapor deposition particles, the vapor deposition particle trapping section being provided to a section corresponding to a gap between different units in each of which one nozzle section out of the vapor deposition particle emitting nozzle section, the intermediate nozzle section, and the heated nozzle section is formed.

11. A vapor deposition method as set forth in claim 10, wherein:

the vapor deposition particle trapping section is a cooling body detachably provided outside the units so as to close the gap between the units.

12. A vapor deposition method as set forth in claim 1, further comprising:

a limiting board provided between the vapor deposition particle injection device and the vapor deposition mask, the limiting board for limiting passage of the vapor deposition particles.

13. A vapor deposition method as set forth in claim 1, wherein:

the film in the predetermined pattern is made of an organic layer in an organic electroluminescent element.

* * * * *